(12) United States Patent
Ko

(10) Patent No.: US 12,255,135 B2
(45) Date of Patent: Mar. 18, 2025

(54) SEMICONDUCTOR DEVICE

(71) Applicant: SAMSUNG ELECTRONICS CO., LTD., Suwon-si (KR)

(72) Inventor: Kyung Yong Ko, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 392 days.

(21) Appl. No.: 17/711,246

(22) Filed: Apr. 1, 2022

(65) Prior Publication Data

US 2023/0014872 A1    Jan. 19, 2023

(30) Foreign Application Priority Data

Jul. 19, 2021    (KR) .................... 10-2021-0094187

(51) Int. Cl.
*H01L 23/522* (2006.01)
*H01L 23/528* (2006.01)
*H01L 29/423* (2006.01)
*H01L 29/78* (2006.01)
*H01L 29/786* (2006.01)

(52) U.S. Cl.
CPC ........ *H01L 23/5226* (2013.01); *H01L 23/528* (2013.01); *H01L 29/42392* (2013.01); *H01L 29/7851* (2013.01); *H01L 29/78696* (2013.01)

(58) Field of Classification Search
CPC ............... H01L 23/5226; H01L 23/528; H01L 29/42392; H01L 29/7851; H01L 29/78696; H01L 27/0886; H01L 21/76811; H01L 21/76813; H01L 21/76834; H01L 21/76849; H01L 21/823431; H01L 29/0673; H01L 29/66439; H01L 29/775; H01L 21/76883; H01L 21/76897; H01L 21/76816; H01L 21/76807; H01L 21/76829; H01L 21/76843; H01L 21/76877; B82Y 10/00

See application file for complete search history.

(56) References Cited

U.S. PATENT DOCUMENTS

| 8,704,343 B2 | 4/2014 | Ponoth et al. |
| 9,324,650 B2 | 4/2016 | Edelstein et al. |

(Continued)

*Primary Examiner* — Mohammad A Rahman
(74) *Attorney, Agent, or Firm* — Sughrue Mion, PLLC

(57) ABSTRACT

A semiconductor device includes: a lower wiring including: a lower filling film, which extends in a first direction and includes a first portion having a first width in the first direction and a second portion, having a second width smaller than the first width in the first direction, on the first portion; and a lower barrier film which is disposed on a side wall and a bottom surface of the first portion, and is not disposed on a side wall of the second portion in a cross-sectional view of the first direction; and an upper wiring structure including: an upper via connected to the lower wiring; and an upper wiring extending in a second direction intersecting the first direction on the upper via, wherein the upper wiring structure further includes an upper barrier film, and an upper filling film in a trench defined by the upper barrier film, each of the upper via and the upper wiring comprises the upper barrier film and the upper filling film, and the upper via is not separated from the upper wiring by the upper barrier film, and is separated from the second portion of the lower filling film by the upper barrier film.

20 Claims, 17 Drawing Sheets

(56) References Cited

U.S. PATENT DOCUMENTS

| | | |
|---|---|---|
| 9,837,314 B2 | 12/2017 | Smith et al. |
| 9,899,982 B2 | 2/2018 | Tsai et al. |
| 9,953,865 B1 | 4/2018 | Briggs et al. |
| 10,177,028 B1 | 1/2019 | LiCausi et al. |
| 10,319,637 B2 | 6/2019 | Mohanty et al. |
| 10,366,919 B2 | 7/2019 | Licausi et al. |
| 10,395,986 B1 | 8/2019 | Briggs et al. |
| 10,699,953 B2 | 6/2020 | Mullick et al. |
| 10,777,456 B1 | 9/2020 | Aizawa et al. |
| 10,879,120 B2 | 12/2020 | Chen et al. |
| 10,886,176 B2 | 1/2021 | Kikuchi et al. |
| 10,892,187 B2 | 1/2021 | Freed et al. |
| 10,957,584 B2 | 3/2021 | Briggs et al. |
| 2010/0164121 A1* | 7/2010 | Feustel ............. H01L 21/76804 |
| | | 257/E23.145 |
| 2018/0122691 A1 | 5/2018 | Briggs et al. |
| 2021/0159117 A1* | 5/2021 | Wang .................. H01L 21/7684 |

* cited by examiner

SEMICONDUCTOR DEVICE

CROSS-REFERENCE TO THE RELATED APPLICATION

This application is based on and claims priority from Korean Patent Application No. 10-2021-0094187 filed on Jul. 19, 2021 in the Korean Intellectual Property Office, the disclosure of which is incorporated herein in its entirely by reference.

BACKGROUND

1. Field

The present disclosure relates to a semiconductor device.

2. Description of the Related Art

As down-scaling of semiconductor elements has progressed rapidly in recent years due to development of electronic technology, high integration and low power consumption of semiconductor chips have been required. A gap between circuit components such as wirings gradually decreases, which causes a problem of increase in resistance between a wiring and a via. Research for solving the problem of increase in resistance between the wiring and the via is being conducted to improve reliability of semiconductor devices.

SUMMARY

Example embodiments of the present disclosure provide a semiconductor device having improved product reliability.

According to an aspect of an example embodiment, a semiconductor device includes: a lower wiring including: a lower filling film, which extends in a first direction and includes a first portion having a first width in the first direction and a second portion, having a second width smaller than the first width in the first direction, on the first portion; and a lower barrier film which is disposed on a side wall and a bottom surface of the first portion, and is not disposed on a side wall of the second portion in a cross-sectional view of the first direction; and an upper wiring structure including: an upper via connected to the lower wiring; and an upper wiring extending in a second direction intersecting the first direction on the upper via, wherein the upper wiring structure further includes an upper barrier film, and an upper filling film in a trench defined by the upper barrier film, each of the upper via and the upper wiring comprises the upper barrier film and the upper filling film, and the upper via is not separated from the upper wiring by the upper barrier film, and is separated from the second portion of the lower filling film by the upper barrier film.

According to an aspect of an example embodiment, a semiconductor device includes: a first lower wiring extending in a first direction; a second lower wiring extending in the first direction and spaced apart from the first lower wiring in a second direction intersecting the first direction; and an upper wiring structure including an upper via connected to the first lower wiring, and an upper wiring extending in the second direction on the upper via, wherein in a cross-sectional view of the second direction, an upper surface of the first lower wiring is disposed above a level of an upper surface of the second lower wiring, wherein the upper wiring structure includes an upper barrier film, and an upper filling film which fills a trench defined by the upper barrier film, each of the upper via and the upper wiring includes the upper barrier film and the upper filling film, and the upper via is not separated from the upper wiring by the upper barrier film, and is separated from the first lower wiring by the upper barrier film.

According to an aspect of an example embodiment, a semiconductor device includes: a first interlayer insulating film; a first lower wiring comprising: a lower filling film which extends in a first direction inside the first interlayer insulating film, and includes a first portion having a first width in the first direction, and a second portion disposed on the first portion and having a second width smaller than the first width in the first direction; and a lower barrier film disposed between the first interlayer insulating film and the first portion of the lower filling film; a second interlayer insulating film disposed on the first interlayer insulating film and the first lower wiring; and an upper wiring structure including an upper wiring extending in a second direction intersecting the first direction, and an upper via being in contact with the second portion of the lower filling film, inside the second interlayer insulating film, wherein each of the upper wiring and the upper via includes an upper barrier film, and an upper filling film which fills a trench defined by the upper barrier film, the upper via is not separated from the upper wiring by the upper barrier film, and is separated from the first lower wiring by the upper barrier film, the first interlayer insulating film is disposed on both side walls of the second portion in a cross-sectional view of the second direction, the second interlayer insulating film is disposed on both side walls of the second portion in a cross-sectional view of the first direction, and the lower barrier film is disposed between the second portion of the lower filling film and the first interlayer insulating film, and is not disposed between the second portion of the lower filling film and the second interlayer insulating film.

However, the present disclosure is not restricted to the embodiments set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof referring to the attached drawings, in which.

DETAILED DESCRIPTION OF THE EMBODIMENTS

All of the embodiments described herein are example embodiments, and thus, the inventive concept is not limited thereto and may be realized in various other forms.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
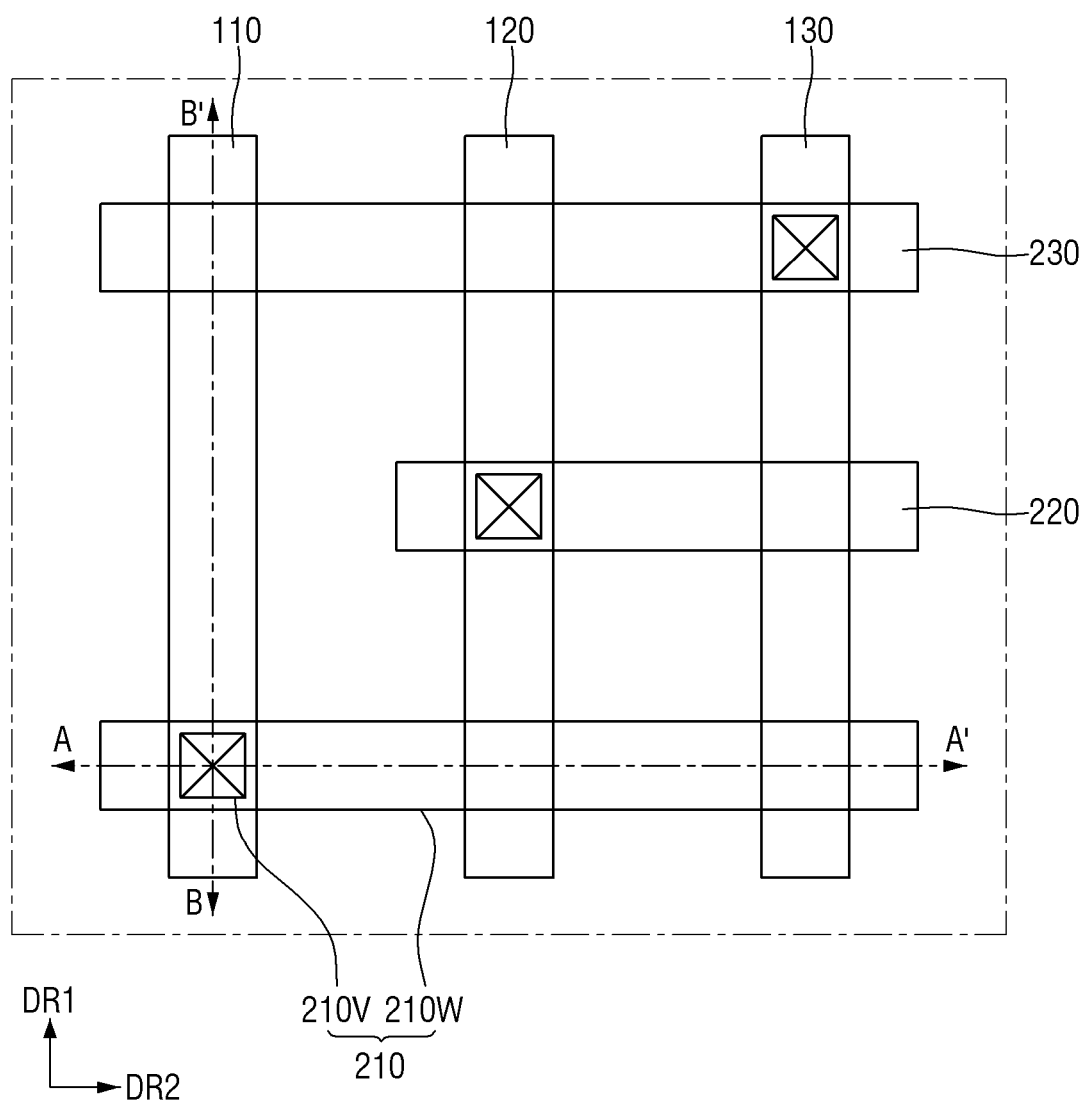
FIG. 1 is a schematic layout diagram for explaining a semiconductor device according to embodiments.
Figure 2:
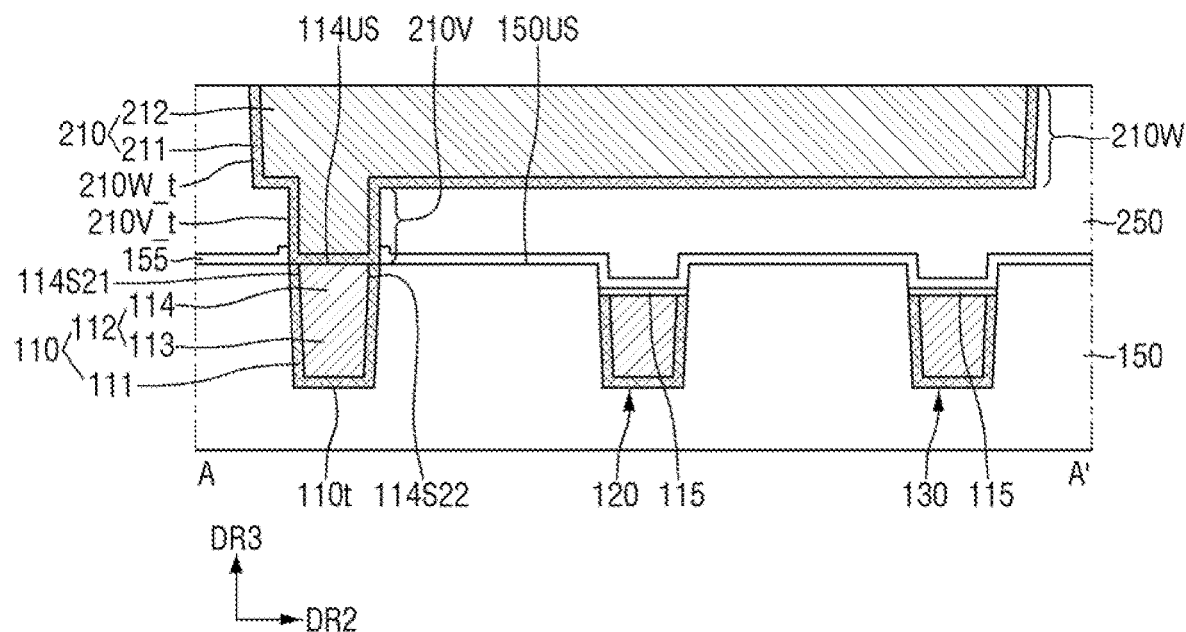
FIG. 2 is a cross-sectional view taken along A-A' of FIG. 1.
Figure 3:
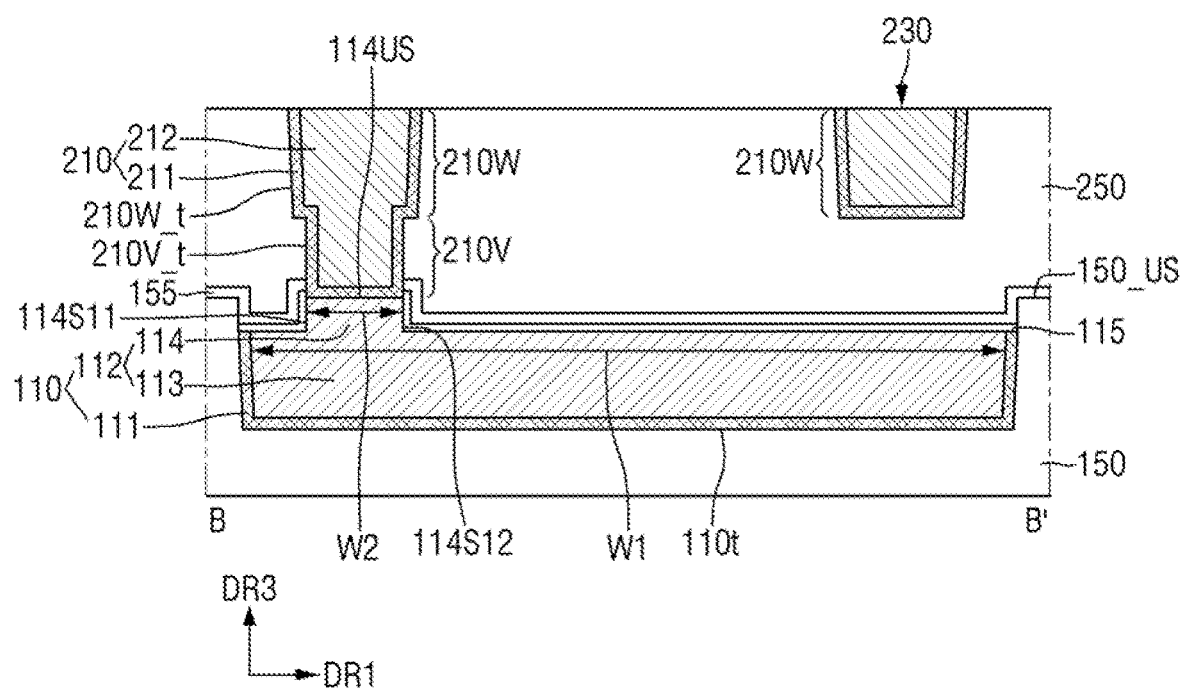
FIG. 3 is a cross-sectional view taken along B-B' of FIG. 1.

FIG. 1 is a schematic layout diagram for explaining a semiconductor device according to embodiments. FIG. 2 is a cross-sectional view taken along A-A' of FIG. 1. FIG. 3 is a cross-sectional view taken along B-B' of FIG. 1.

Referring to FIGS. 1 to 3, the semiconductor device according to embodiments may include a first interlayer insulating film 150, first to third lower wirings 110, 120 and 130, a second interlayer insulating film 250, and first to third upper wiring structures 210, 220 and 230.

The first interlayer insulating film 150 may include, for example, at least one of silicon oxide, silicon nitride, silicon oxynitride and a low dielectric constant material. The low dielectric constant material may be, for example, a silicon oxide having an appropriately high carbon and hydrogen, and may be a material such as SiCOH. When carbon is included in an insulating material, a dielectric constant of the insulating material may be lowered. However, in order to further lower the dielectric constant of the insulating material, the insulating material may include a pore such as a cavity filled with gas or air inside the insulating material.

The low dielectric material may include, for example, but is not limited to, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped Silicon Oxide), OSG (Organo Silicate Glass), SiLK, Amorphous Fluorinated Carbon, silica aerogels, silica xerogels, mesoporous silica or combinations thereof.

A plurality of lower wiring trenches 110*t* may be formed inside the first interlayer insulating film 150. The lower wiring trenches 110*t* may extend in a first direction DR1, and may be spaced apart in a second direction DR2.

The first to third lower wirings 110, 120 and 130 may be disposed in the first interlayer insulating film 150. The first to third lower wirings 110, 120 and 130 may be disposed inside the lower wiring trenches 110*t*, respectively. The first to third lower wirings 110, 120 and 130 may extend in the first direction DR1, and may be spaced in the second direction DR2.

Each of the first to third lower wirings 110, 120 and 130 may include a lower barrier film 111 and a lower filling film 112. The lower filling film 112 may be disposed on the lower barrier film 111.

The lower filling film 112 may include a first portion 113 having a first width W1 in the first direction DR1, and a second portion 114 having a second width W2 in the first direction DR1. The second portion 114 may be disposed on the first portion 113. On the basis of a third direction DR3, the second portion 114 may be disposed above the first portion 113, according to an embodiment. The first width W1 may be greater than the second width W2. An upper surface of the first portion 113 may be disposed below an upper surface 114_US of the second portion 114. Therefore, a side wall of the lower filling film 112 in the first direction DR1 may have a step structure in a connecting portion between the first portion 113 and the second portion 114. The side walls of the lower filling film 112 in the first direction DR1 may have a stepped shape.

In other words, the lower filling film 112 may include a portion having a first thickness in the third direction DR3, and a portion having a second thickness greater than the first thickness. An upper via 210V, which will be described later, may be formed on the portion having the second thickness.

In the semiconductor device according to embodiments, the side walls 114S11 and 114S12 of the second portion 114 in the first direction DR1 may be substantially vertical.

The upper surface 114US of the second portion 114 may be disposed on a same level as a top surface 150US of the first interlayer insulating film 150. As used herein, the term "same" means substantially the same level that is acceptable by a technician of the same field, and includes a minute error that is acceptable by a technician of the same field.

The lower filling film 112 may be an integrated structure. As used herein, the integrated structure means a structure that is in direct contact with no internal boundary. The first portion 113 and the second portion 114 may be an integrated structure that is in direct contact with no internal boundary. According to an embodiment, the integrated structure of the first portion 113 and the second portion 114 may be formed by a one-time continuous deposition.

The lower barrier film 111 may extend along a bottom surface and side walls of the lower wiring trench 110*t*. The lower barrier film 111 may extend along a part of the side walls of the lower wiring trench 110*t*. The lower barrier film 111 may be disposed between the first interlayer insulating film 150 and the lower filling film 112. The first interlayer insulating film 150 may be spaced apart from the lower filling film 112 by the lower barrier film 111.

The lower barrier film 111 may extend along side walls and a bottom surface of the first portion 113. The lower barrier film 111 may extend along the side walls of the first portion 113 in the first direction DR1 and the side walls of the first portion 113 in the second direction DR2. The lower barrier film 111 may be disposed on the side walls 114S21 and 114S22 of the second portion 114 in the cross-sectional view of the second direction DR2, and may not be disposed on the side walls 114S11 and 114S12 of the second portion 114 in the cross-sectional view of the first direction DR1. The lower barrier film 111 may not extend along a bottom surface of the second portion 114. That is, the first portion 113 and the second portion 114 may not be separated by the lower barrier film 111.

A capping film 115 may be disposed on the respective first to third lower wirings 110, 120 and 130. The capping film 115 may be disposed on the first portion 113, the lower barrier film 111 and the side walls 114S11 and 114S12 of second portion 114 in the cross-sectional view of the first direction DR1. The capping film 115 may extend along an upper surface of the first portion 113, an upper surface of the lower barrier film 111, and the side walls 114S11 and 114S12 of the second portion 114 in the first direction DR1. The capping film 115 may be disposed on the first portion 113 between the lower barrier films 111.

According to embodiments, the capping film 115 may not be disposed on the upper surface 114US of the second portion 114 and an upper surface of the lower barrier film 111 that surrounds the second portion 114. The capping film 115 may expose the upper surface 114US of the second portion 114 and the upper side of the lower barrier film 111 that surrounds the second portion 114.

The capping film 115 may also be formed on the first to third upper wiring structures 210, 220 and 230 to be described below. The capping film 115 may be disposed on the first to third upper wiring structures 210, 220 and 230 between upper barrier films 211.

The capping film 115 may include, for example, at least one of cobalt (Co), ruthenium (Ru) and manganese (Mn). However, the embodiments are not limited thereto.

An etching stop film 155 may be disposed on the first interlayer insulating film 150 and the capping film 115. The etching stop film 155 may extend along the first interlayer insulating film 150 and the upper surface of the first portion 113 in the first direction DR1. The etching stop film 155 may also be disposed on the side walls 114S11 and 114S12 of the second portion 114.

The etching stop film 155 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), aluminum oxide (AlO), aluminum nitride (AlN), aluminum oxycarbide (AlOC) and combinations thereof. Although the etching stop film 155 is shown as a single film, this is only for convenience of explanation, and the embodiment is not limited thereto. Of course, unlike that shown, the etching stop film 155 may include a plurality of insulating films.

The second interlayer insulating film 250 may be disposed on the etching stop film 155. The second interlayer insulating film 250 may include, for example, at least one of silicon oxide, silicon nitride, silicon oxynitride and a low dielectric constant material. The second interlayer insulating film 250 may be formed of a material or a material combination the same as or different from the first interlayer insulating film 150.

An upper via hole 210V_t may be formed inside the second interlayer insulating film 250, the etching stop film 155 and the capping film 115. The upper via hole 210V_t may penetrate the second interlayer insulating film 250, the etching stop film 155 and the capping film 115 to expose the second portion 114. The upper via hole 210V_t may expose the upper surface 114US of the second portion 114.

A plurality of upper wiring trenches 210W_t may be formed inside the second interlayer insulating film 250. The upper wiring trenches 210W_t may extend in the second direction DR2, and spaced apart in the first direction DR1. The upper wiring trenches 210W_t may extend from an upper surface of the second interlayer insulating film 250 to the upper via hole 210V_t in the third direction DR3. The upper wiring trench 210W_t may penetrate the second interlayer insulating film 250 to be connected to the upper via hole 210V_t. For example, a maximum width of the upper via hole 210V_t may be smaller than a minimum width of the upper wiring trench 210W_t.

In the semiconductor device according to embodiments, the width of the lower wiring trench 110t may decrease in a downward direction from the first to third upper wiring structures 210, 220 and 230. The width of the upper wiring trench 210W_t and the width of the upper via hole 210V_t may increase in an upward direction from the lower wirings 110, 120 and 130. In the semiconductor device according to embodiments, the width of the lower wiring trench 110t, the width of the upper wiring trench 210W_t, and the width of the upper via hole 210V_t may be substantially constant. As used herein, the term "constant" means a substantially constant level that is acceptable by persons of ordinary skill in the art, and includes a minute error that is acceptable by the persons of ordinary skill in the art.

The first to third upper wiring structures 210, 220 and 230 may be disposed inside the second interlayer insulating film 250. The first to third upper wiring structures 210, 220 and 230 may be disposed inside the upper wiring trench 210W_t and the upper via hole 210V_t. The first to third upper wiring structures 210, 220 and 230 may extend in the second direction DR2 and may be spaced apart in the first direction DR1.

Each of the first to third upper wiring structures 210, 220 and 230 may include an upper barrier film 211 and an upper filling film 212. The upper filling film 212 may be disposed on the upper barrier film 211.

The upper barrier film 211 may extend along side walls of the upper wiring trench 210W_t, and side walls and a bottom surface of the upper via hole 210V_t, in the second direction DR2. The upper filling film 212 may fill the upper wiring trench 210W_t and the upper via hole 210V_t on the upper barrier film 211. That is, the upper filling film 212 may fill a trench defined by the upper barrier film 211.

The lower barrier film 111 and the upper barrier film 211 may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh) and a two-dimensional (2D) material. In the semiconductor device according to some embodiments, the two-dimensional material may be a metallic material and/or a semiconductor material. The two-dimensional (2D) material may include a two-dimensional allotrope or a two-dimensional compound, and may include, but is not limited to, for example, but is not limited to, at least one of graphene, molybdenum disulfide ($MoS_2$), molybdenum diselenide ($MoSe_2$), tungsten diselenide ($WSe_2$), tungsten disulfide ($WS_2$), tantalum disulfide ($TaS_2$), tantalum diselenide ($TaSe_2$). That is, since the above-mentioned two-dimensional materials are only listed by way of example, the two-dimensional materials that may be included in the semiconductor device of the present disclosure are not limited by the above-mentioned materials. The lower barrier film 111 may be formed of a material or a material combination the same as or different from the upper barrier film 211.

The lower filling film 112 and the upper filling film 212 may include, for example, at least one of aluminum (Al), copper (Cu), tungsten (W), cobalt (Co), ruthenium (Ru), silver (Ag), gold (Au), manganese (Mn), molybdenum (Mo), rhodium (Rh), iridium (Ir), RuAl, NiAl, $NbB_2$, $MoB_2$, $TaB_2$, $V_2AlC$ and CrAlC. When the lower wiring filling film 110b includes copper (Cu), the lower wiring filling film 110b may include, for example, carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), zirconium (Zr) or the like. The lower filling film 112 may be formed of a material or a material combination the same as or different from the upper filling film 212.

Alternatively, the first to third lower wirings 110, 120 and 130 and/or the first to third upper wiring structures 210, 220 and 230 may be a single film structure.

Each of the first to third upper wiring structures 210, 220 and 230 may include an upper via 210V, and an upper wiring 210W extending in the second direction DR2 on the upper via 210V.

Each of the upper via 210V and the upper wiring 210W may include an upper barrier film 211 and an upper filling film 212. According to embodiments, the upper wiring 210W may not be separated from the upper via 210V by the upper barrier film 211. The upper via 210V and the upper wiring 210W may be an integrated structure.

The upper via 210V may be separated from the second portion 114 of the lower filling film 112 by the upper barrier film 211. The upper via 210V may come into contact with the second portion 114 of the lower filling film 112. The upper barrier film 211 may come into contact with the second portion 114 of the lower filling film 112. Therefore, the first upper wiring structure 210 may be connected to the first lower wiring 110, the second upper wiring structure 220 may be connected to the second lower wiring 120, and the third upper wiring structure 230 may be connected to the third lower wiring 130.

In the semiconductor device according to embodiments, in the first direction DR1 and/or the second direction DR2, the width of a lower surface of the upper via 210V may be the same as the width of an upper surface of each of the first to third lower wirings 110, 120 and 130 that is in contact with the upper via 210V. For example, referring to FIGS. 2 and 3, in the first direction DR1 and/or the second direction DR2, the width of the lower surface of the upper via 210V of the first upper wiring structure 210 may be the same as the width of the top surface of the first lower wiring 110, which may be the same as the upper surface 114US of the second portion 114 of the lower filling film 112 of the first lower wiring 110.

In the semiconductor device according to embodiments, the upper via 210V may be aligned with the first to third lower wirings 110, 120 and 130 connected to the upper via 210V in the first direction DR1 and/or the second direction DR2. For example, referring to FIGS. 2 and 3, the upper via 210V of the first upper wiring structure 210 may be aligned with the first lower wiring 110 in the first direction DR1 and/or the second direction DR2. The upper via 210V of the first upper wiring structure 210 may be in contact with the top surface of the first lower wiring 110.

In the semiconductor device according to embodiments, side walls of the upper via 210V may not include a step structure. The side walls of the upper via 210V may be in a straight line shape. The side walls of the upper via 210V may include substantially no slope. The side walls of the upper via 210V may be substantially vertical.

Further, in a cross-sectional view of the upper via 210V taken in the second direction DR2, the upper surfaces of the first to third lower wirings 110, 120 and 130 connected to the upper via 210V may be disposed above the upper surfaces of the first to third lower wirings 110, 120 and 130 that are not connected to the upper via 210V. For example, referring to FIG. 2, in a cross-sectional view of the first upper wiring structure 210 taken in the second direction DR2, the upper surface of the first lower wiring 110 may be disposed above the upper surface of the second lower wiring 120 and the upper side of the third lower wiring 130. In the cross-sectional view of the first upper wiring structure 210 taken in the second direction DR2, the first lower wiring 110 may fill the lower wiring trench 110t, and the second and third lower wirings 120 and 130 may fill a part of the lower wiring trench 110t.

Figure 4:
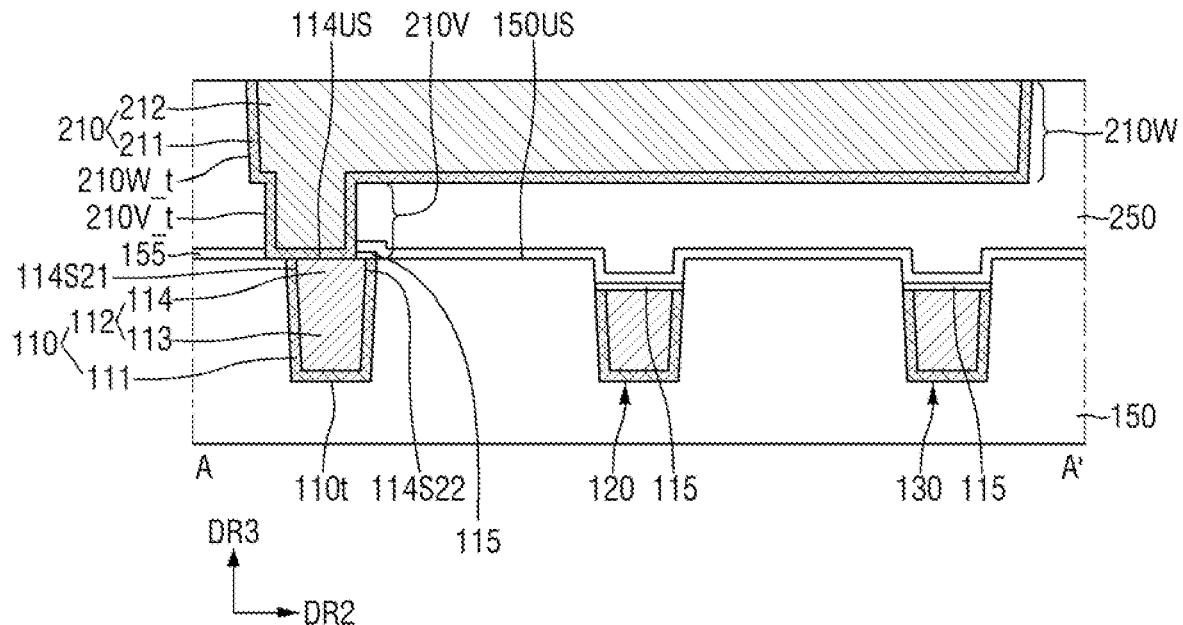
FIG. 4 is a cross-sectional view for explaining a semiconductor device according to embodiments.

FIG. 4 is a cross-sectional view for explaining a semiconductor device according to embodiments. For reference, FIG. 4 is a cross-sectional view taken along A-A' of FIG. 1. For convenience of explanation, points different from those described using FIGS. 1 to 3 will be mainly described. As the semiconductor device shown in FIG. 4 includes the same elements of the semiconductor device shown in FIGS. 1 to 3, that the same reference numbers are used for the same elements in the descriptions below.

Referring to FIG. 4, the upper via 210V of the semiconductor device according to embodiments may be in contact with the first lower wiring 110 and the first interlayer insulating film 150. However, unlike the first lower wiring 110 shown in FIG. 2, the first lower wiring 110 shown in FIG. 4 may be disposed below the upper via 210V in a partial overlapping manner.

According to embodiments, the capping film 115 may be disposed on the upper surface 114US of the second portion 114 and on the upper surface of the lower barrier film 111 that surrounds the second portion 114 of the lower filling film 112 of the first lower wiring 110. The capping film 115 may expose a part of the upper surface 114US of the second portion 114 and the upper surface of the lower barrier film 111 that surrounds the second portion 114. The upper via 210V may penetrate the capping film 115 and come into contact with the first lower wiring 110. That is, a part of the upper surface 114US of the second portion 114 and the upper surface of the lower barrier film 111 that surrounds the second portion 114 may come into contact with the upper via 210V, and a remaining part may come into contact with the capping film 115.

Figure 5:
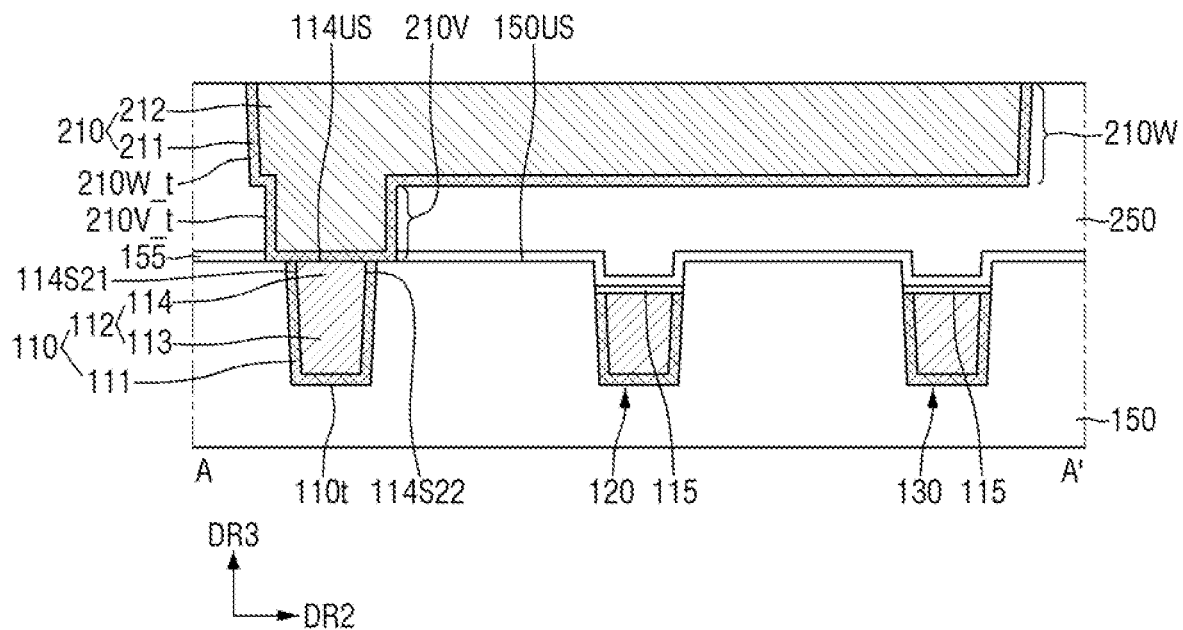
FIG. 5 is a cross-sectional view for explaining a semiconductor device according to embodiments.

FIG. 5 is a cross-sectional view for explaining a semiconductor device according to embodiments. For reference, FIG. 5 is a cross-sectional view taken along A-A' of FIG. 1. For convenience of explanation, points different from those described using FIGS. 1 to 3 will be mainly described. As the semiconductor device shown in FIG. 5 includes the same elements of the semiconductor device shown in FIGS. 1 to 3, that the same reference numbers are used for the same elements in the descriptions below.

In the semiconductor device according to embodiments, in the first direction DR1 and/or the second direction DR2, the width of the lower surface of the upper via 210V may be greater than the widths of the upper surfaces of the first to third lower wirings 110, 120 and 130 that are in contact with the upper via 210V. Accordingly, the upper via 210V may be in contact with the upper surfaces of the first to third lower wirings 110, 120 and 130 and the top side 150US of the first interlayer insulating film 150.

For example, referring to FIG. 5, in the first direction DR1 and/or the second direction DR2, the width of the lower surface of the upper via 210V of the first upper wiring structure 210 may be greater than the width of the top surface of the first lower wiring 110, which may be the same as the upper surface 114US of the second portion 114 of the lower filling film 112 of the first lower wiring 110. The upper via 210V of the first upper wiring structure 210 may be in contact with the top surface of the first lower wiring 110 and the top surface 150US of the first interlayer insulating film 150. The upper via 210V of the first upper wiring structure 210 may be in contact with the upper surface 114US of the second portion 114 of the lower filling film 112, the upper surface of the lower barrier film 111 that surrounds the second portion 114, and the top surface 150US of the first interlayer insulating film 150.

Figure 6:
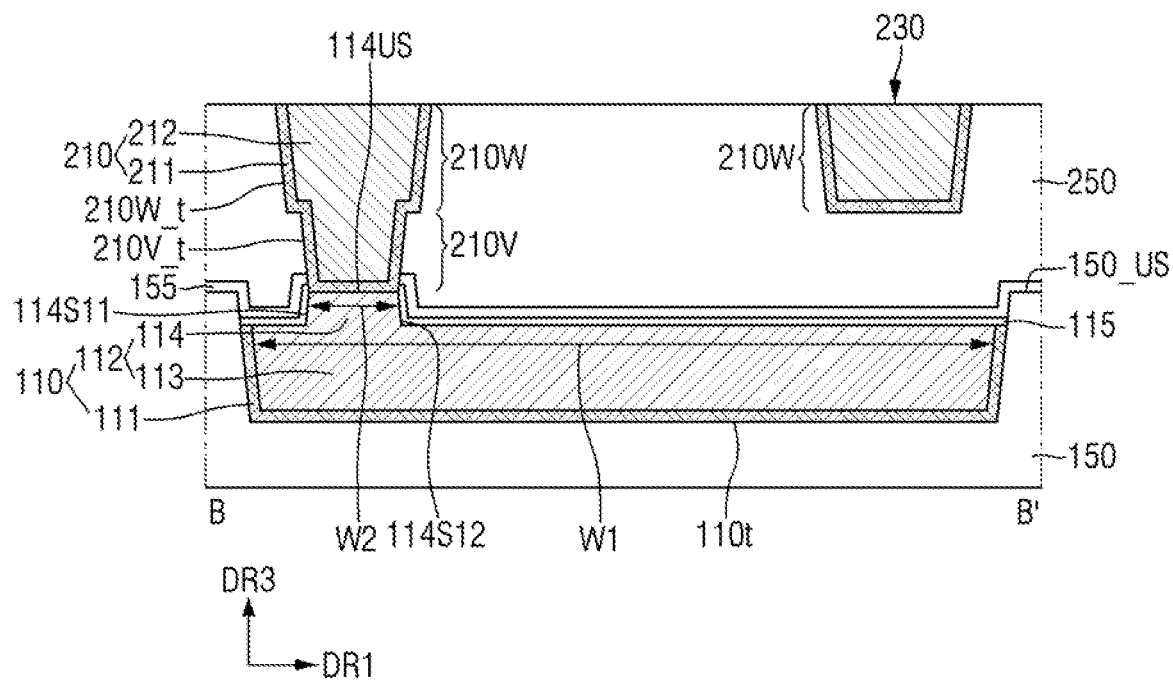
FIG. 6 is a cross-sectional view for explaining a semiconductor device according to embodiments.

FIG. 6 is a cross-sectional view for explaining a semiconductor device according to embodiments. For reference, FIG. 6 is a cross-sectional view taken along B-B' of FIG. 1. For convenience of explanation, points different from those described using FIGS. 1 to 3 will be mainly described. As the semiconductor device shown in FIG. 6 includes the same elements of the semiconductor device shown in FIGS. 1 to 3, that the same reference numbers are used for the same elements in the descriptions below.

Referring to FIG. 6, in the semiconductor device according to embodiments, the width of the lower wiring trench 110t in the first direction DR1 may decrease in the downward direction from the first and third upper wiring structures 210 and 230. The width of the first portion 113 of the lower filling film 112 of the first lower wiring 110 in the first direction DR1 may decrease in the downward direction from the first and third upper wiring structures 210 and 230.

The width W2 of the second portion 114 in the first direction DR1 may increase in the downward direction from the first and third upper wiring structures 210 and 230.

The width of the upper wiring trench 210W_t and the width of the upper via hole 210V tin the first direction DR1 may increase in the upward direction from the first lower wiring 110.

Figure 7:
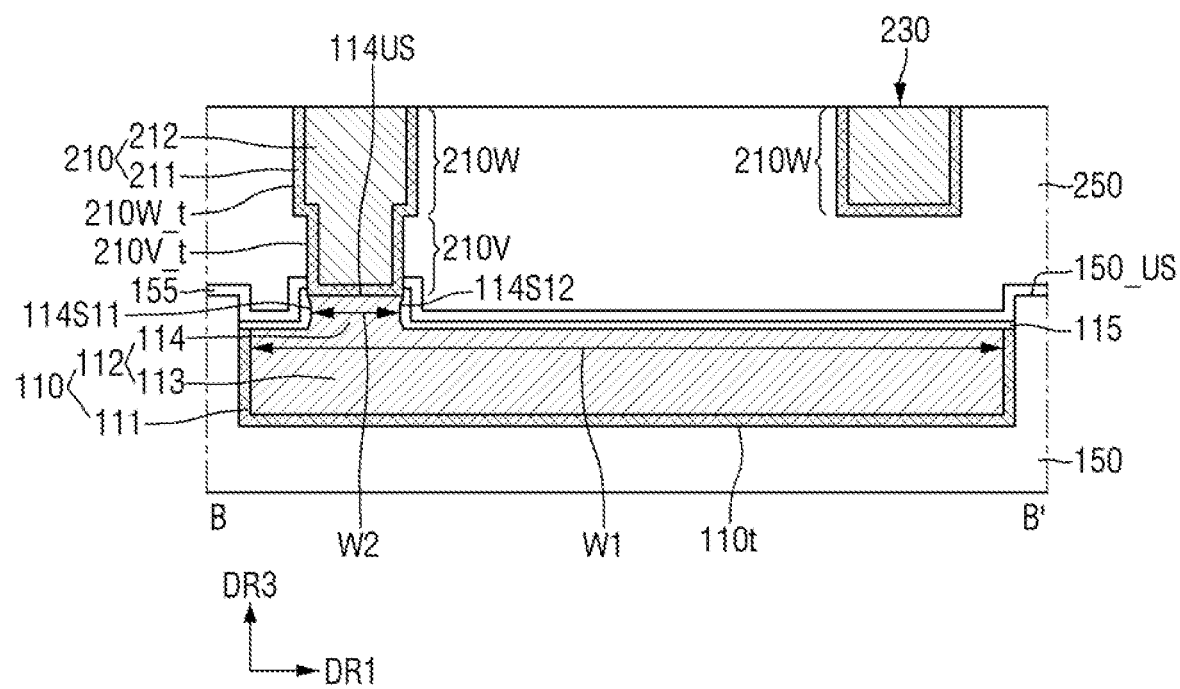
FIG. 7 is a cross-sectional view for explaining a semiconductor device according to embodiments.

FIG. 7 is a cross-sectional view for explaining a semiconductor device according to embodiments. For reference, FIG. 7 is a cross-sectional view taken along B-B' of FIG. 1. For convenience of explanation, points different from those described using FIGS. 1 to 3 will be mainly described. As the semiconductor device shown in FIG. 7 includes the same elements of the semiconductor device shown in FIGS. 1 to 3, that the same reference numbers are used for the same elements in the descriptions below.

Referring to FIG. 7, in the semiconductor device according to embodiments, the side walls 114S11 and 114S12 of the second portion 114 of the lower filling film 112 in the first direction DR1 may include a rounded shape. The side walls 114S11 and 114S12 of the second portion 114 in the first direction DR1 may include a portion that is convex toward the second portion 114. This may be due to the fabricating process for forming the second portion 114.

On the other hand, the side walls 114S21 and 114S22, as shown in FIG. 2, of the second portion 114 in the second direction DR2 may not include a rounded shape. The side walls 114S21 and 114S22 of the second portion 114 in the second direction DR2 may be in a straight line shape. That is, the side walls 114S11 and 114S12 of the second portion 114 in the first direction DR1 may have a shape that is different from the side walls 114521 and 114522 of the second portion 114 in the second direction DR2 in the embodiment of FIG. 7.

Figure 8:
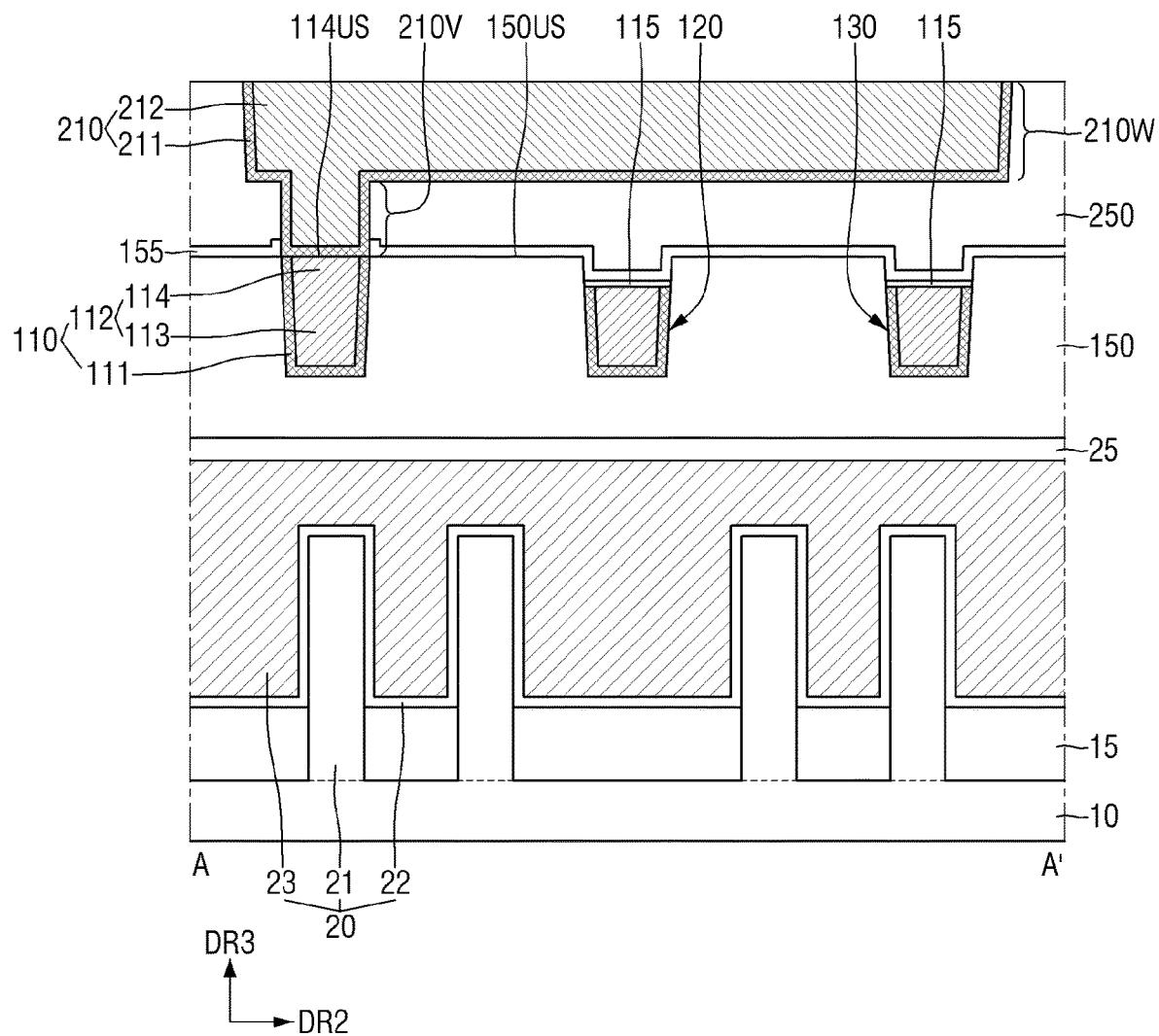
FIG. 8 is a cross-sectional view for explaining a semiconductor device according to embodiments.

FIG. 8 is a cross-sectional view for explaining a semiconductor device according to embodiments. For reference, FIG. 8 is a cross-sectional view taken along A-A' of FIG. 1, and is a cross-sectional view taken along the gate electrode 23. For convenience of explanation, points different from those described using FIGS. 1 to 3 will be mainly described. As the semiconductor device shown in FIG. 8 includes the same elements of the semiconductor device shown in FIGS. 1 to 3, that the same reference numbers are used for the same elements in the descriptions below.

Referring to FIG. 8, the semiconductor device according to embodiments may further include a substrate 10, and a transistor 20 disposed between the substrate 10 and the first interlayer insulating film 150.

The substrate 10 may be a silicon substrate or an SOI (silicon-on-insulator). In contrast, the substrate 10 may include, but is not limited to, silicon germanium, SGOI (silicon germanium on insulator), indium antimonide, lead tellurium, indium arsenide, indium phosphide, gallium arsenide or gallium antimonide.

The transistor 20 may include a fin-shaped pattern 21, a gate electrode 23 on the fin-shaped pattern 21, and a gate insulating film 22 between the fin-shaped pattern 21 and the gate electrode 23. The transistor 20 may further include source/drain patterns disposed on both sides of the gate electrode 23.

The fin-shaped pattern 21 may protrude from the substrate 10. The fin-shaped pattern 21 may extend long in the first direction DR1. The fin-shaped pattern 21 may be a part of the substrate 10, and may include an epitaxial layer that is grown from the substrate 10. The fin-shaped pattern 21 may include, for example, silicon or germanium, which are elemental semiconductor materials. Further, the fin-shaped pattern 21 may include a compound semiconductor, and may include, for example, a group IV-IV compound semiconductor or a group III-V compound semiconductor.

The group IV-IV compound semiconductor may include, for example, a binary compound or a ternary compound including at least two or more of carbon (C), silicon (Si), germanium (Ge), and tin (Sn), or a compound obtained by doping these elements with a group IV element. The group III-V compound semiconductor may be, for example, at least one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

A field insulating film 15 may be formed on the substrate 10. The field insulating film 15 may be formed on a part of the side wall of the fin-shaped pattern 21. The fin-shaped pattern 21 may protrude upward from the upper surface of the field insulating film 15. The field insulating film 15 may include, for example, an oxide film, a nitride film, an oxynitride film or a combination film thereof.

The gate electrode 23 may be disposed on the fin-shaped pattern 21. The gate electrode 23 may extend in the second direction DR2. The gate electrode 23 may intersect the fin-shaped pattern 21.

The gate electrode 23 may include, for example, at least one of a metal, a conductive metal nitride, a conductive metal carbonitride, a conductive metal carbide, a metal silicide, a doped semiconductor material, a conductive metal oxynitride, and a conductive metal oxide.

The gate insulating film 22 may be disposed between the gate electrode 23 and the fin-shaped pattern AF and between the gate electrode 23 and the field insulating film 15. The gate insulating film 22 may include, for example, silicon oxide, silicon oxynitride, silicon nitride, or a high dielectric constant material having a higher dielectric constant than silicon oxide. The high dielectric constant material may include, for example, at least one of boron nitride, metal oxide, and metal silicon oxide.

The semiconductor device according to some other embodiments may include an NC (Negative Capacitance) FET that uses a negative capacitor. For example, the first gate insulating film 22 may include a ferroelectric material film having ferroelectric properties, and a paraelectric material film having paraelectric properties.

The ferroelectric material film may have a negative capacitance, and the paraelectric material film may have a positive capacitance. For example, when two or more capacitors are connected in series, and the capacitance of each capacitor has a positive value, the entire capacitance decreases from the capacitance of each individual capacitor. On the other hand, when at least one of the capacitances of two or more capacitors connected in series has a negative value, the entire capacitance may be greater than an absolute value of each individual capacitance, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance value, a transistor including the ferroelectric material film may have a subthreshold swing (SS) of 60 mV/decade or less at room temperature.

The gate capping pattern 25 may be disposed on the gate electrode 23. The first to third lower wirings 110, 120 and 130 may be disposed on the gate electrode 23. Although the first to third lower wirings 110, 120 and 130 are shown as not being connected to the gate electrode 23, the embodiment is not limited thereto. One of the first to third lower wirings 110, 120 and 130 may be connected to the gate electrode 23.

Figure 9:
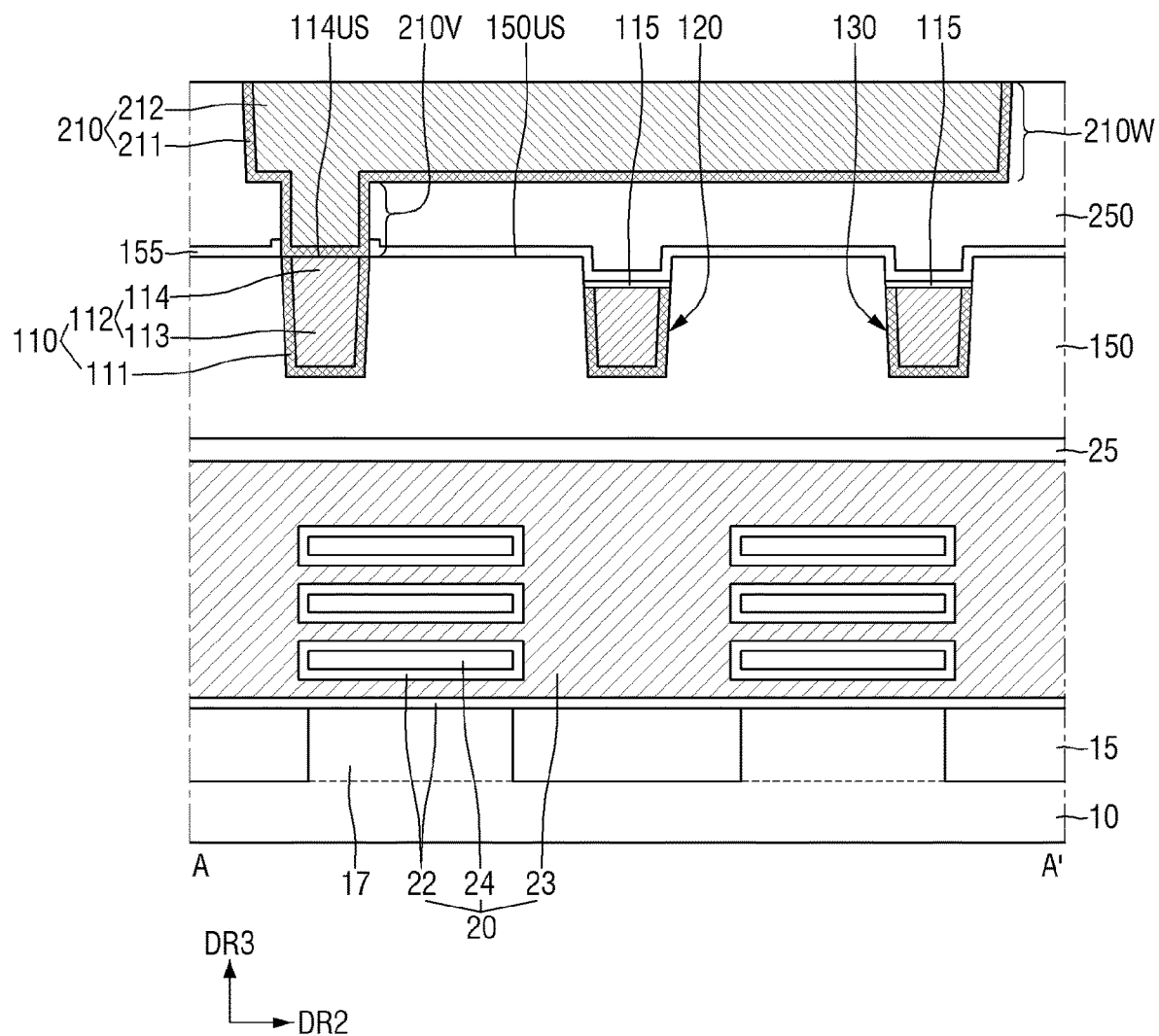
FIG. 9 is a cross-sectional view for explaining a semiconductor device according to embodiments.

FIG. 9 is a cross-sectional view for explaining a semiconductor device according to embodiments. For reference, FIG. 9 is a cross-sectional view taken along A-A' of FIG. 1, and taken along the gate electrode 23. For convenience of explanation, points different from those described using FIG. 8 will be mainly described. As the semiconductor device shown in FIG. 9 includes the same elements of the semiconductor device shown in FIGS. 1 to 3, that the same reference numbers are used for the same elements in the descriptions below.

Referring to FIG. 9, in the semiconductor device according to some embodiments, a transistor 20 may include a nanosheet 24, a gate electrode 23 that surrounds the nanosheet 24, and a gate insulating film 22 between the nanosheet 24 and the gate electrode 23.

The nanosheet 24 may be disposed on the lower fin-shaped pattern 17. The nanosheet 24 may be spaced apart from the lower fin-shaped pattern 17 in the third direction DR3. Although the transistor 20 is shown as including three nanosheets 24 spaced apart from each other in the third direction DR3, the embodiment is not limited thereto. Of course, the number of nanosheets 24 disposed on the lower fin-shaped pattern 17 in the third direction DR3 may be greater or smaller than three.

The lower fin-shaped pattern 17 and the nanosheet 24 may each include, for example, silicon or germanium which are elemental semiconductor materials. The lower fin-shaped pattern 17 and the nanosheet 24 may each include compound semiconductors, and may include, for example, a group IV-IV compound semiconductor or a group III-V compound semiconductor. The lower fin-shaped pattern 17 and the nanosheet 24 may include the same material or different materials from each other.

Figure 10:
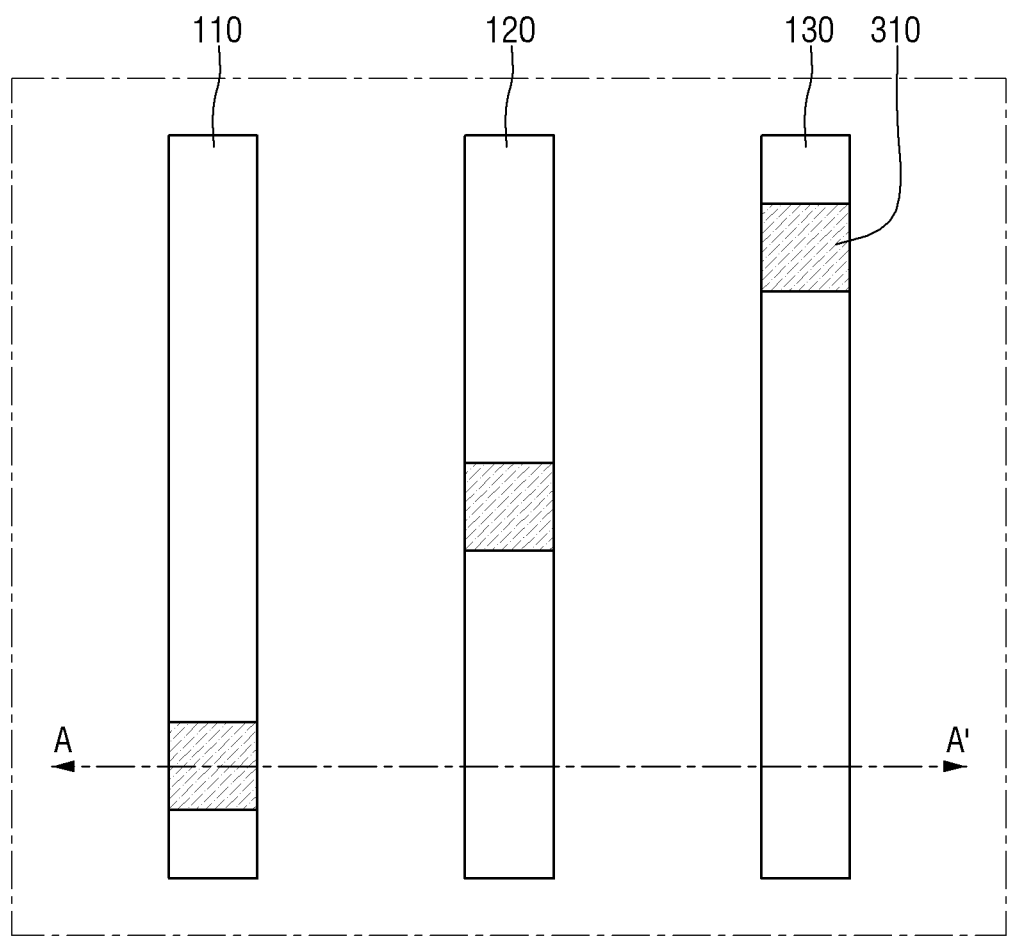
FIGS. 10 to 23 are intermediate stage diagrams for explaining a method of fabricating the semiconductor device according to embodiments.
Figure 11:
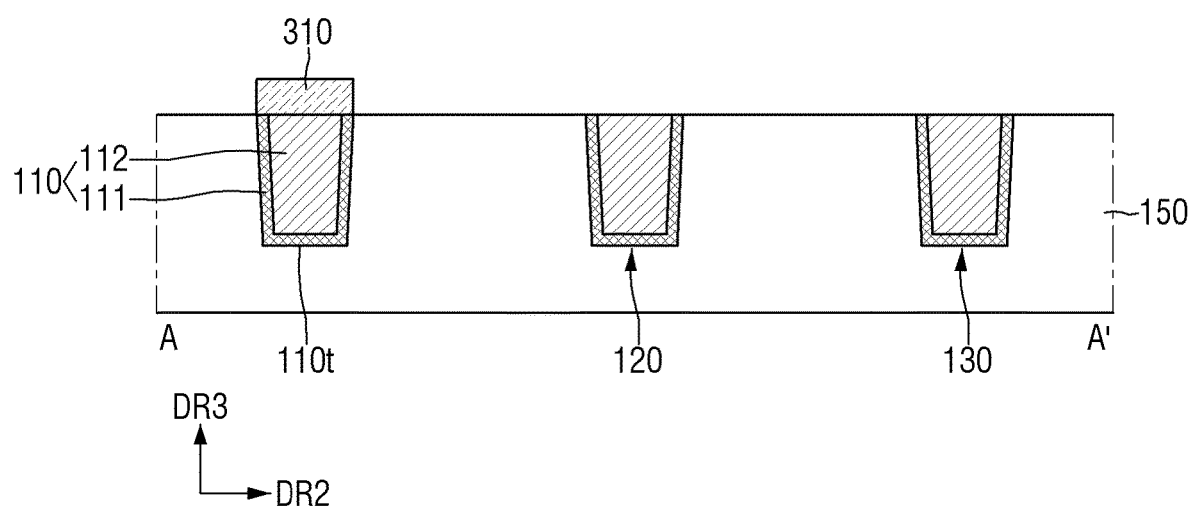
Figure 12:
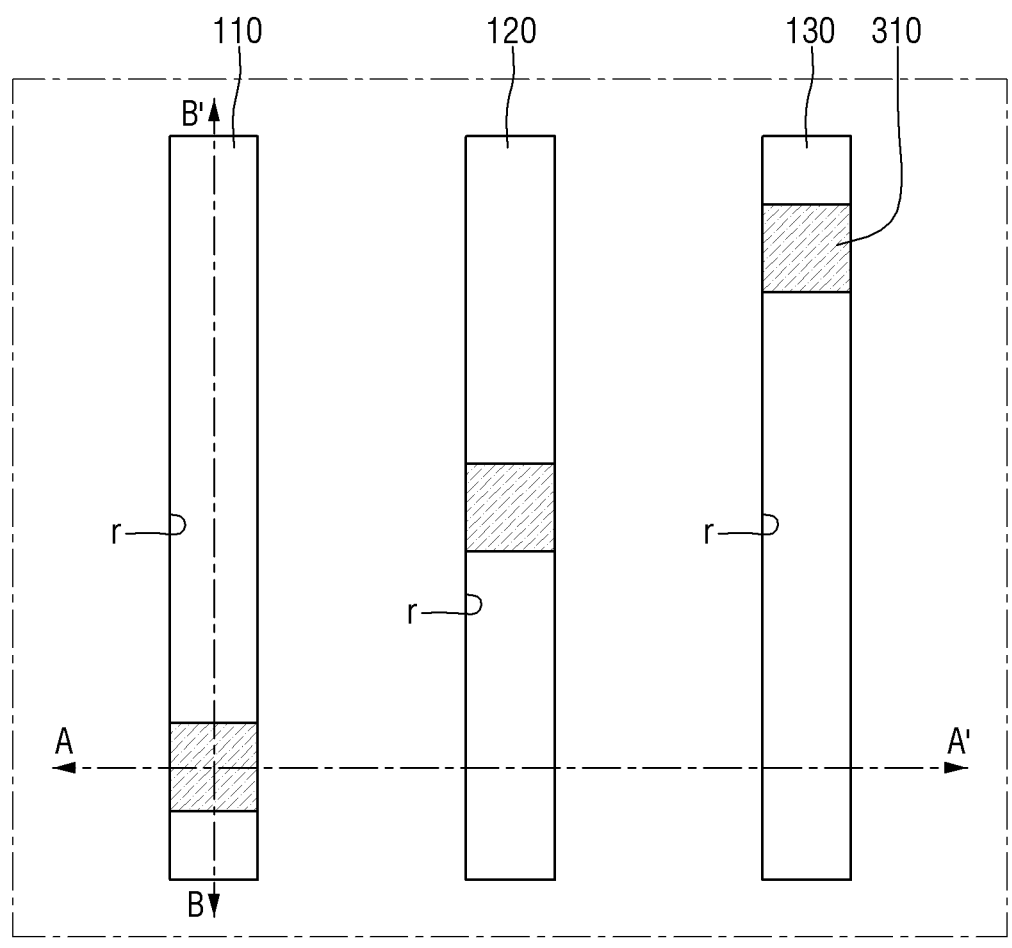
Figure 13:
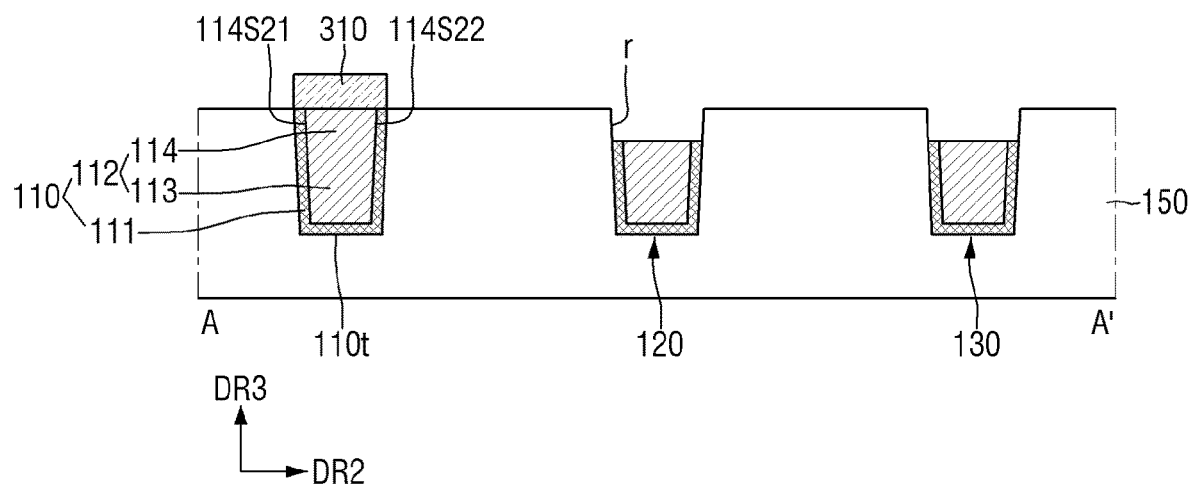
Figure 14:
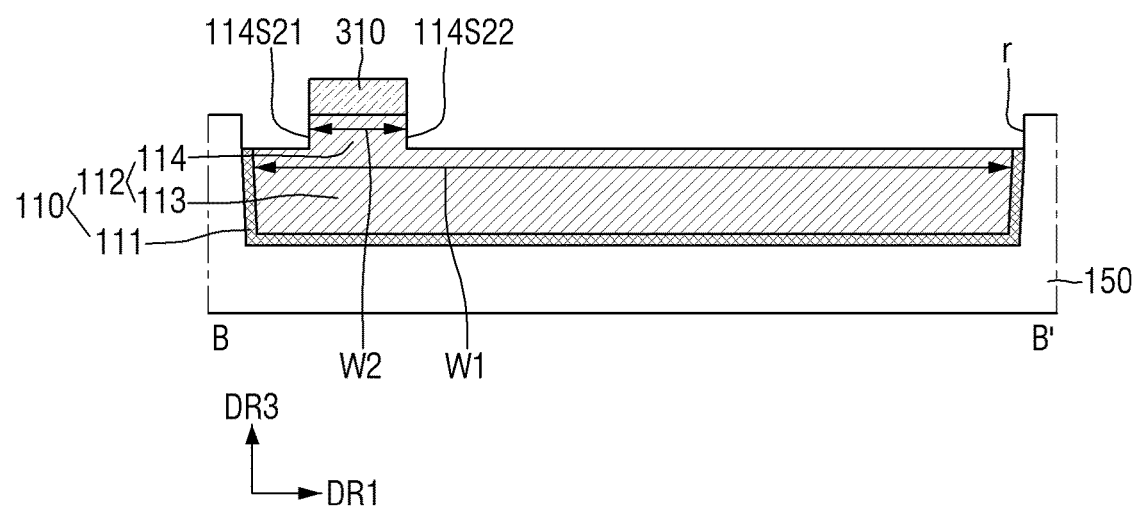

FIGS. 10 to 23 are intermediate stage diagrams for explaining a method of fabricating a semiconductor device according to embodiments. For reference, FIG. 11 is a cross-sectional view taken along A-A' of FIG. 10, FIG. 13 is a cross-sectional view taken along A-A' of FIG. 12, FIG. 14 is a cross-sectional view taken along B-B' of FIG. 12, FIGS. 16 to 18 are cross-sectional views taken along A-A' of FIG. 15, and FIGS. 21 to 23 are cross-sectional views taken along A-A' of FIG. 20. The line A-A' of FIGS. 10, 12, 15, 19 and 20 may correspond to the line A-A' of FIG. 1, and the line B-B' of FIG. 12 may correspond to the line B-B' of FIG. 1. As the semiconductor devices shown in FIGS. 10 to 23 include the same elements of the semiconductor device shown in FIGS. 1 to 3, that the same reference numbers are used for the same elements in the descriptions below.

Referring to FIGS. 10 and 11, the lower wiring trenches 110t may be formed inside the first interlayer insulating film 150. The lower wiring trenches 110t may extend in the first direction DR1, and may be spaced apart from each other in the second direction DR2.

The lower barrier film 111 may be formed along the bottom surface and side walls of the lower wiring trench 110t. The lower filling film 112 may be disposed on the lower barrier film 111 to fill the lower wiring trench 110t. Accordingly, the first to third lower wirings 110, 120 and 130 that fill the respective lower wiring trenches 110t may be formed.

Subsequently, a first mask pattern 310 may be formed at a position where a via to be described below is formed. The first mask pattern 310 may be formed on the first to third lower wirings 110, 120 and 130 at positions where a via 201V is formed later. The first mask pattern 310 may expose the upper surface of the first interlayer insulating film 150 and the upper surfaces of the first to third lower wirings 110, 120 and 130 at positions where the via 201V is not formed later.

For example, after a pre mask that is disposed on the first interlayer insulating film 150 and the first to third lower wirings 110, 120 and 130 are formed, the pre mask may be patterned to form the first mask pattern 310.

Referring to FIGS. 12 to 14, some of the first to third lower wirings 110, 120 and 130 may be etched, using the first mask pattern 310 as an etching mask. Therefore, the first to third lower wirings 110, 120 and 130 may include a recess r.

Side walls of the recess r in the first direction DR1 may be defined by the first to third lower wirings 110, 120 and 130 that are not exposed by the first interlayer insulating film 150 and the first mask pattern 310, and the side walls of the recess r in the second direction DR2 may be defined by the first interlayer insulating film 150. The bottom side of the recess r may be defined by the first to third lower wirings 110, 120 and 130 exposed by the first mask pattern 310.

Also, the first portion 113 of the lower filling film 112 having the first width W1 in the first direction DR1, and the second portion 114 of the lower filling film 112 having the second width W2 in the first direction DR1 may be formed by the recess r. The second portion 114 of the lower filling film 112 may include a first side wall 114S11 and a second side wall 114S12 that are opposite to each other in the first direction DR1, and a third side wall 114S21 and a fourth side wall 114S22 that are opposite to each other in the second direction DR2.

The first side wall 114S11 of the second portion 114 and the lower barrier film 111 on the second side wall 114S12 may be removed by an etching process for forming the recess r. Accordingly, the lower barrier film 111 may be disposed on the third side wall 114S21 and the fourth side wall 114S22 of the second portion 114, and the bottom side and the side walls of the first portion 113.

Figure 15:
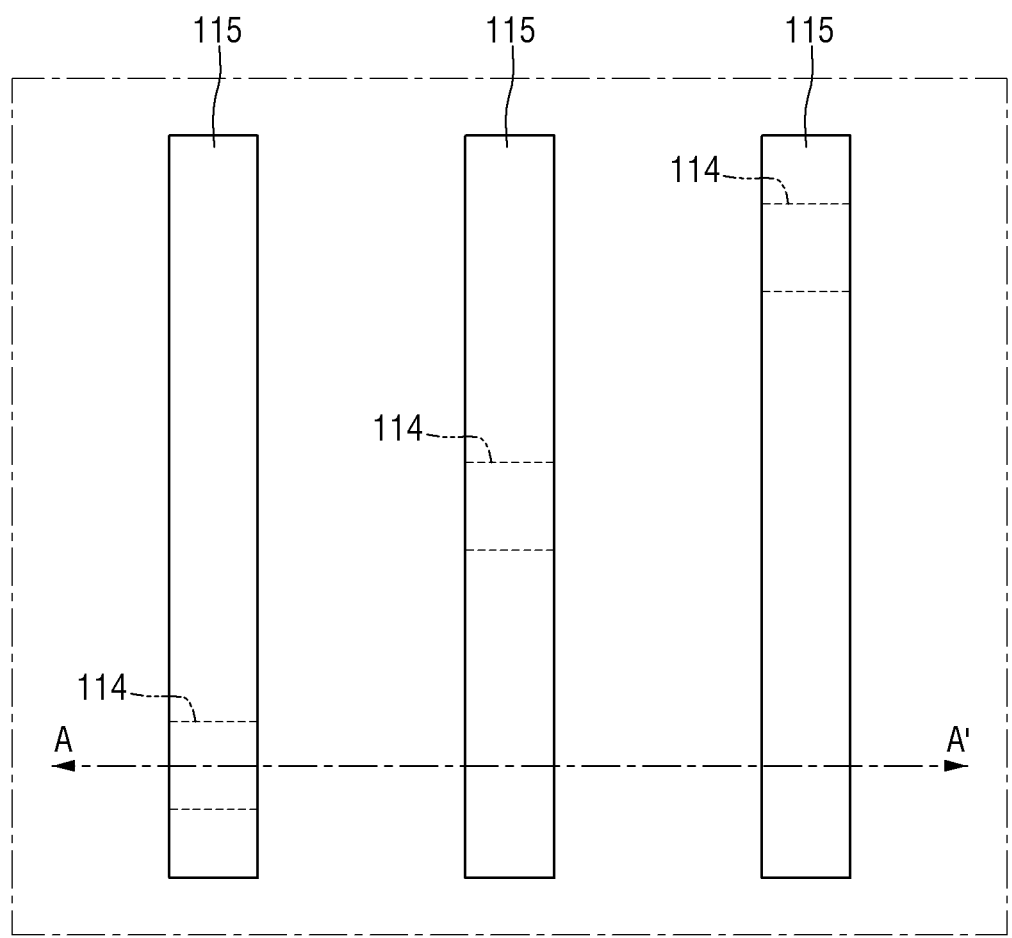
Figure 16:
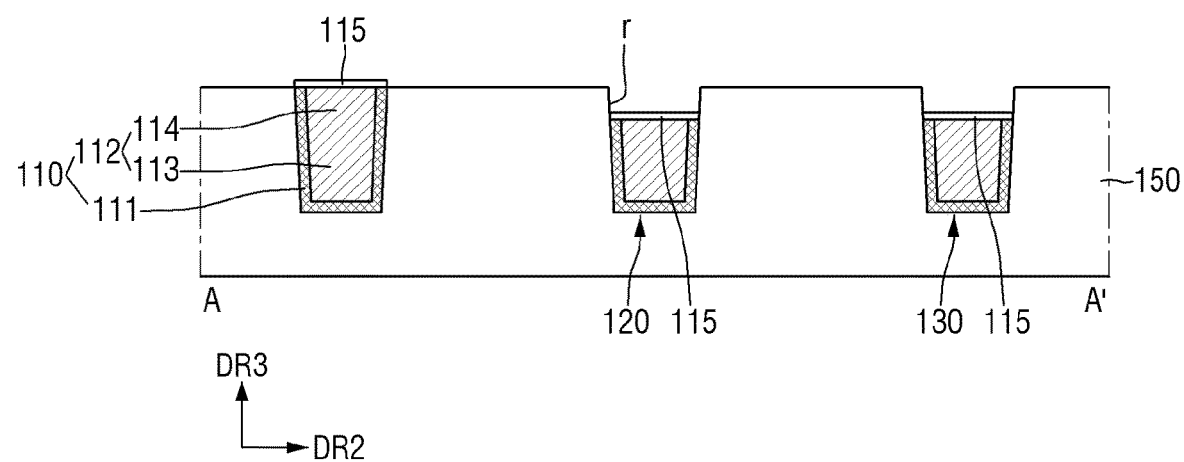

Referring to FIGS. 15 and 16, the first mask pattern 310 may be removed.

Subsequently, the capping film 115 may be formed on the first to third lower wirings 110, 120 and 130. The capping film 115 may be disposed on the first to third lower wirings 110, 120 and 130. The capping film 115 may extend along the upper surfaces of the first to third lower wirings 110, 120 and 130 and the first and second side walls (114S11 and 114S12 of FIGS. 13 and 14) of the second portion 114.

Figure 17:
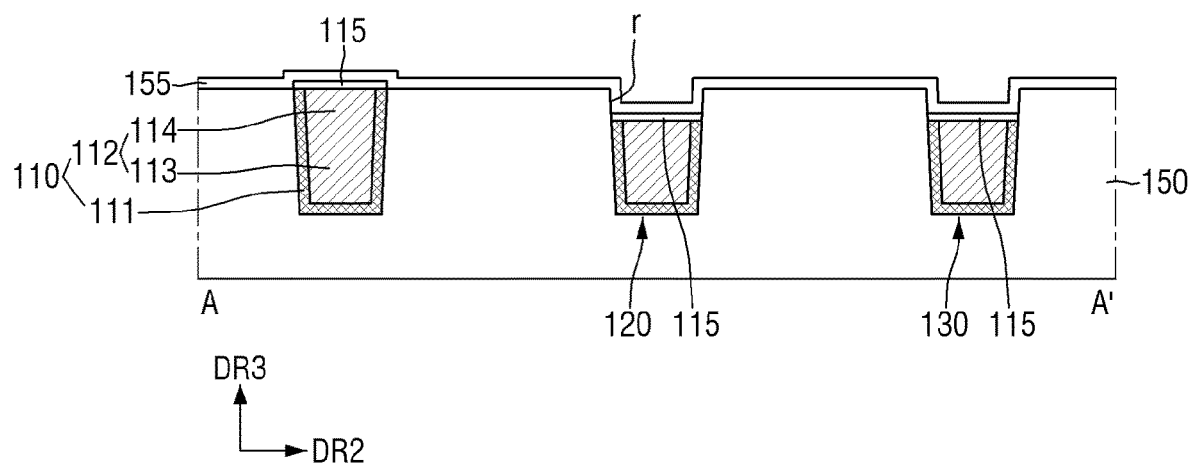

Referring to FIG. 17, the etching stop film 155 may be formed on the first interlayer insulating film 150 and the capping film 115. The etching stop film 155 may be disposed on the first interlayer insulating film 150 and the capping film 115. The etching stop film 155 may extend along the upper surface of the first interlayer insulating film 150, the side walls and upper surface of the capping film 115 on the first lower wiring 110, the upper surface of the capping film 115 on the second and third lower wirings 120 and 130, and the side walls of the recess r exposed by the capping film 115.

Figure 18:
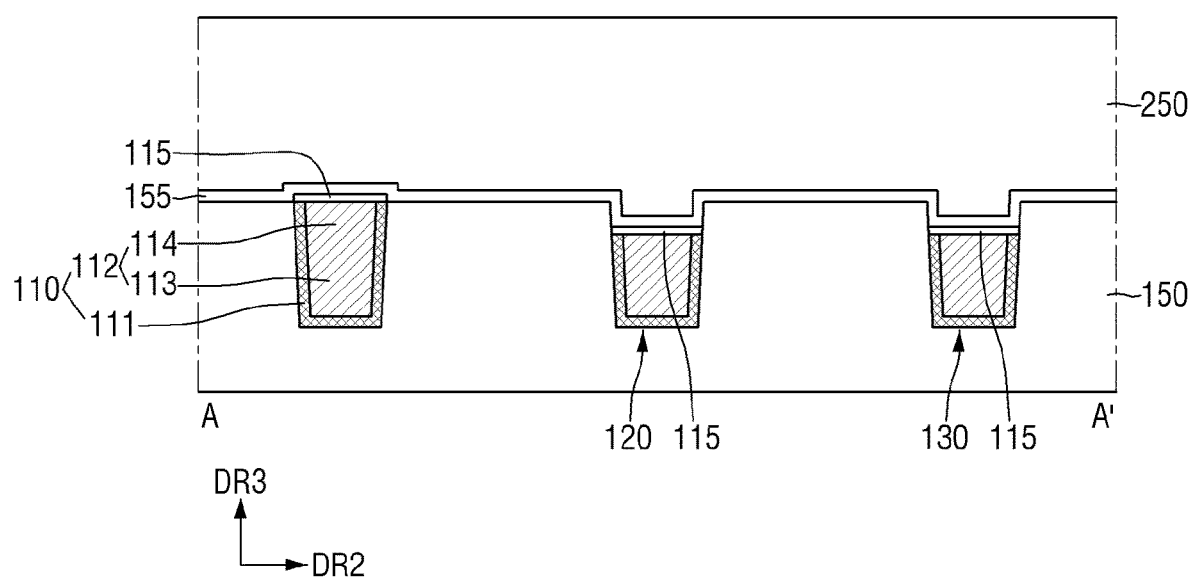

Referring to FIG. 18, the second interlayer insulating film 250 may be formed on the etching stop film 155. The second interlayer insulating film 250 may be disposed on the etching stop film 155.

Figure 19:
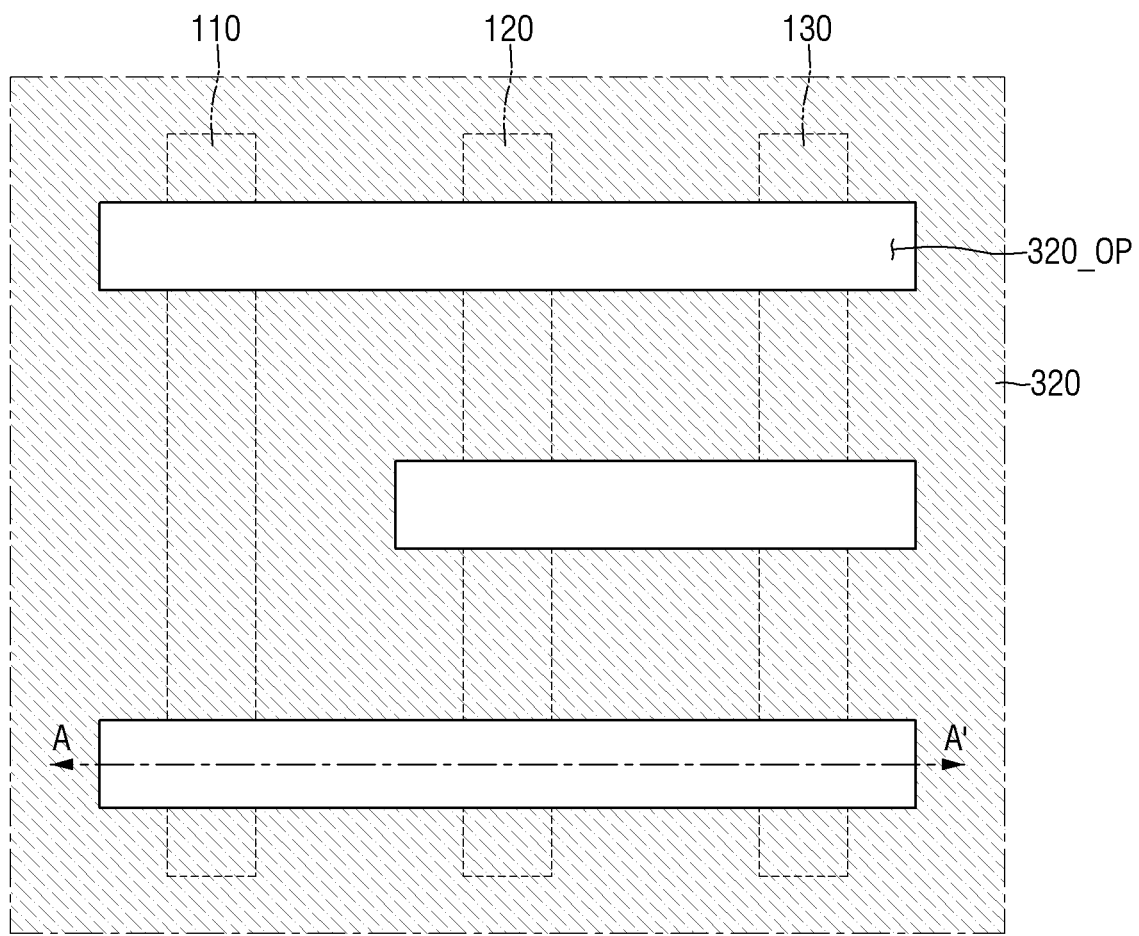

Referring to FIG. 19, a second mask pattern 320 may be formed on the second interlayer insulating film 250. The second mask pattern 320 may include an opening 320_OP. The opening 320_OP may expose the upper surface of the second interlayer insulating film 250 at positions where the first to third upper wiring structures 210, 220 and 230 are formed later.

Figure 20:
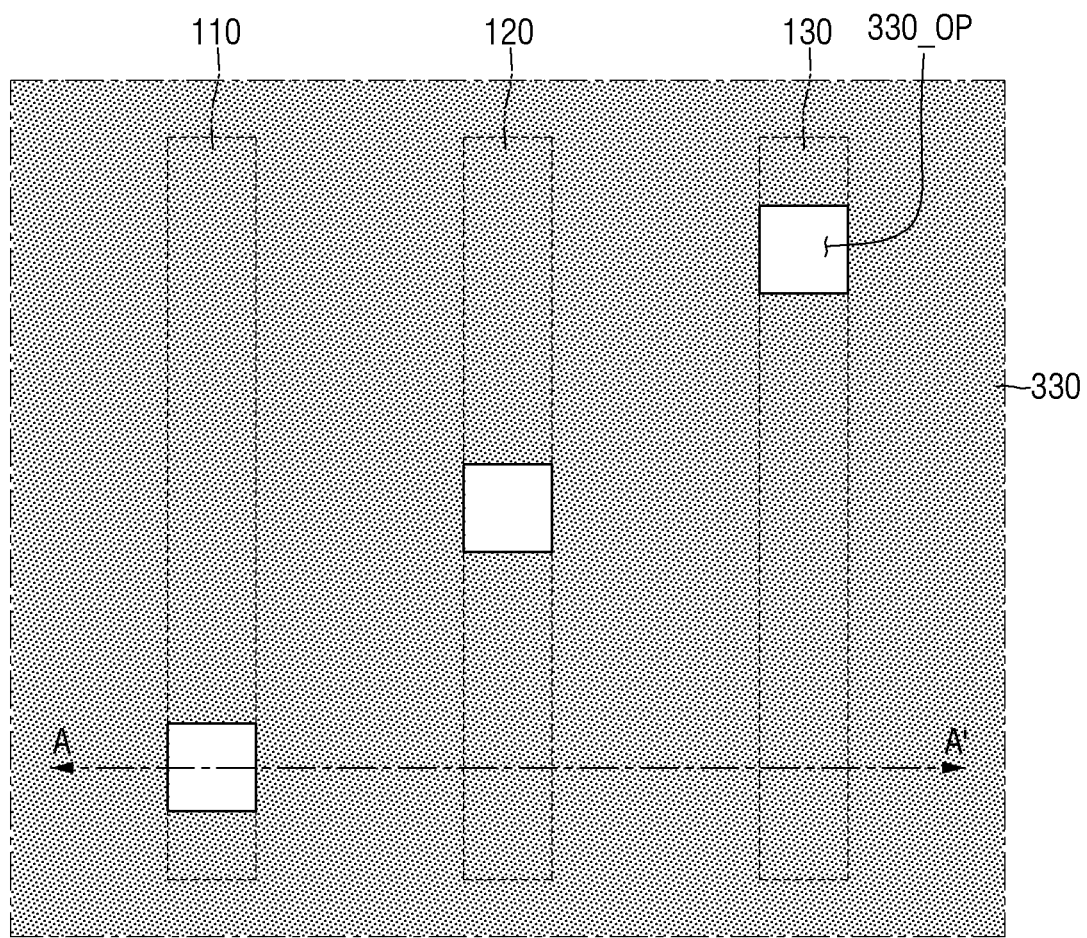
Figure 21:
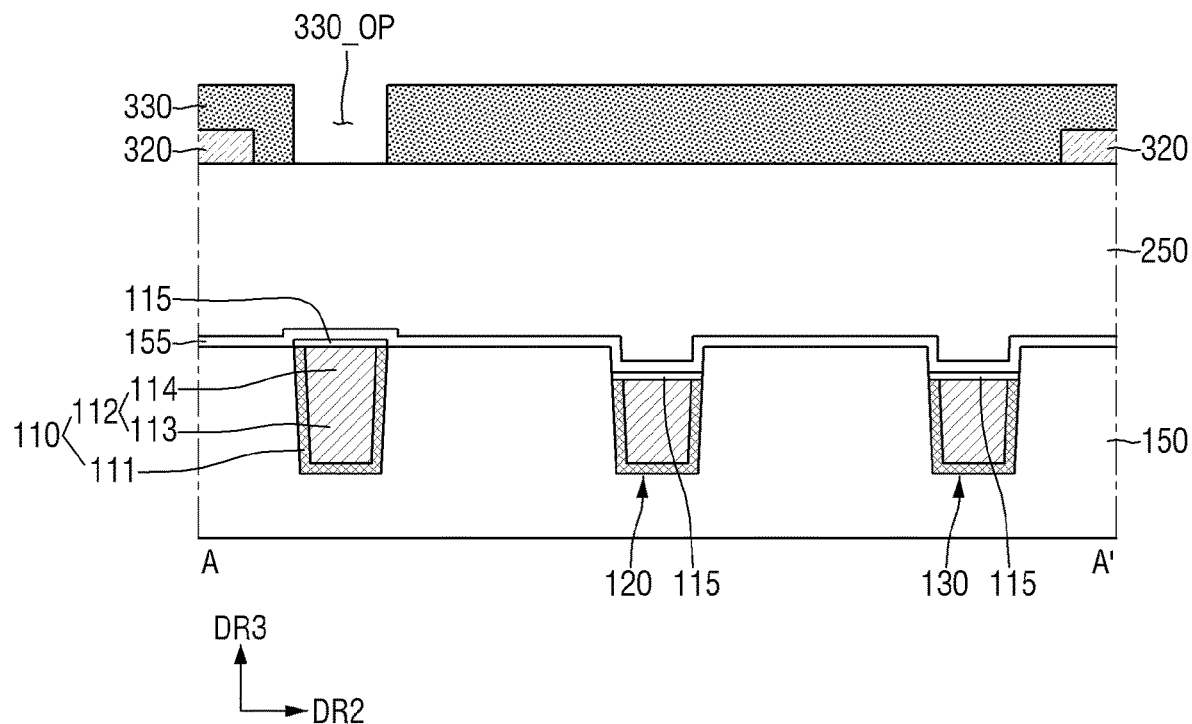

Referring to FIGS. 20 and 21, a third mask pattern 330 may be formed. The third mask pattern 330 may include an opening 330_OP. The opening 330_OP may expose the position where the via 201V is formed later. For example, the opening 330_OP may expose the upper surface of the second interlayer insulating film 250 at the position where the via 201V is formed later.

The opening 330_OP of the third mask pattern 330 may be formed at a position corresponding to the first mask pattern 310 of FIG. 10. For example, the third mask pattern 330 may be a tone-inverted first mask pattern 310. For example, a width of the third mask pattern 330 in the first direction DR1 may be the same as a width of the first mask pattern 310 in the first direction DR1, and a width of the third mask pattern 330 in the second direction DR2 may be the same as the width of the first mask pattern 310 in the first direction DR1.

Figure 22:
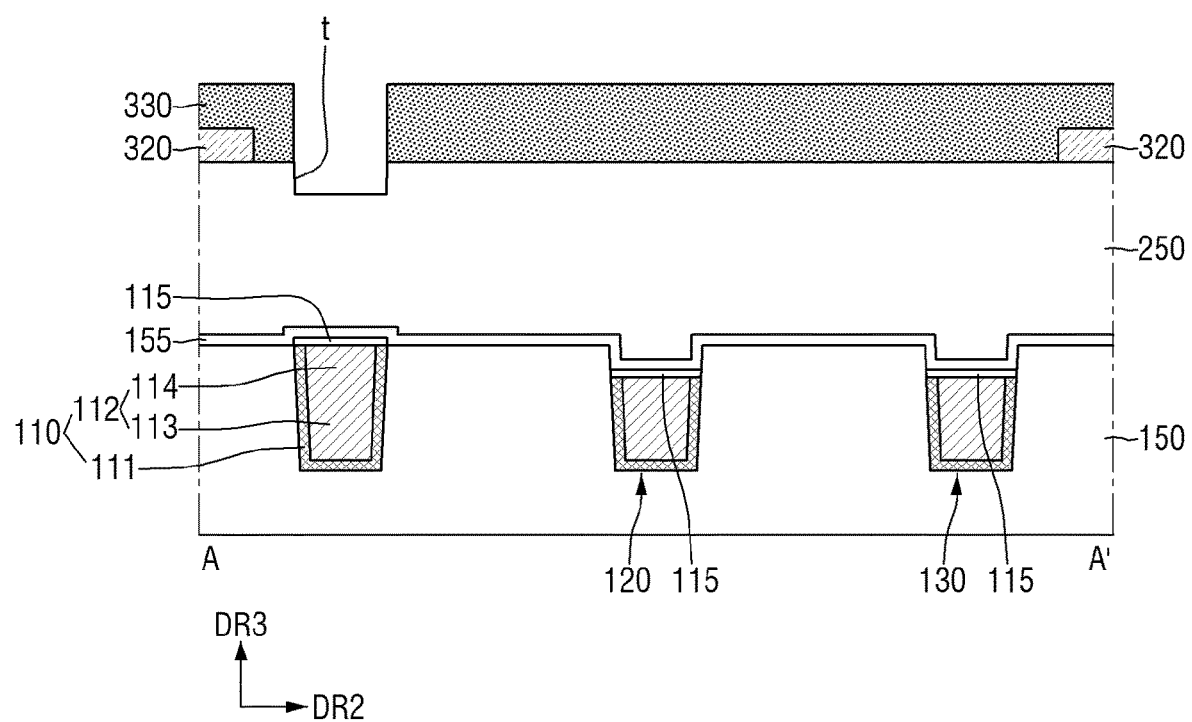

Referring to FIG. 22, a part of the second interlayer insulating film 250 may be etched, using the third mask pattern 330 as an etching mask. Therefore, the second interlayer insulating film 250 may include a trench t.

Figure 23:
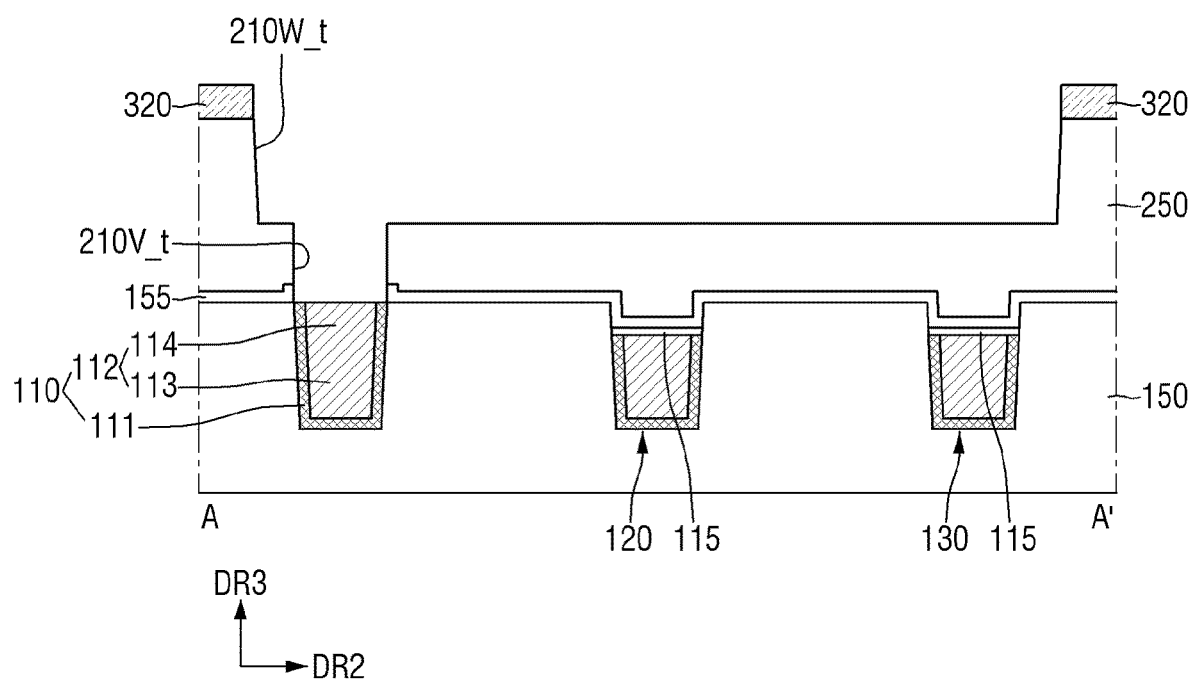

Referring to FIG. 23, the third mask pattern 330 may be removed.

Subsequently, the second interlayer insulating film 250 may be etched, using the second mask pattern 320 as an etching mask. The etching process may be performed up to the etching stop film 155. Subsequently, the exposed etching stop film 155 may be removed.

Accordingly, an upper wiring trench including the upper via hole 210V_t and the upper wiring trench 210W_t may be formed. The upper wiring trench 210W_t may be connected to the upper via hole 210V_t. The upper via hole 210V_t may be formed, for example, at a position corresponding to the trench t of FIG. 22. The upper via hole 210V_t may overlap, for example, the trench t of FIG. 22 in the third direction DR3.

Subsequently, referring to FIG. 2, the second mask pattern 320 may be removed.

Subsequently, the upper barrier film 211 extending along the side walls and bottom surface of the upper wiring trench 210t may be formed. The upper barrier film 211 may extend along the side walls and bottom side of the upper wiring trench 210t. The upper filling film 212 may be formed on the upper barrier film 211. The upper filling film 212 may fill the upper wiring trench 210t on the upper barrier film 211. Accordingly, the upper wiring structure 210 including the upper via 210V and the upper wiring 210W may be formed. The upper via 210V may fill the upper via hole 210V_t and the upper wiring 210W may fill the upper wiring trench 210t.

When the via is formed by utilizing a mask pattern for forming the via and a mask pattern for forming the upper wiring, misalignment between the via and the lower wiring may be prevented by the mask pattern for forming the upper wiring in the direction in which the lower wiring extends. However, there may be a misalignment between the via and the lower wiring in the direction in which the upper wiring extends. Further, since a distance between the via and the lower wiring to which the via is not connected is not secured by a certain distance, a short circuit may occur between the via and the lower wiring to which the via is not connected.

In order to prevent this, an insulating film that exposes the upper surface of the lower wiring may be formed on the interlayer insulating film. That is, the insulating film may be formed only on the interlayer insulating film between the lower wirings. Therefore, the upper surface of the lower wiring may be disposed below the upper surface of the insulating film. Therefore, the distance between the via and the lower wiring to which the via is not connected may be secured by a certain distance. However, since the insulating film may also be formed on a part of the upper surface of the lower wiring, a contact area between the via and the lower wiring may be reduced.

Alternatively, the upper part of the lower wiring may be partially etched. Accordingly, the upper surface of the lower wiring may be disposed below the upper surface of the interlayer insulating film, and the distance between the via and the lower wiring to which the via is not connected may be secured by a certain distance. Also, the contact area between the via and the lower wiring may not be reduced. However, a recess may be formed at an end in the direction in which the lower wiring extends and/or in the direction in which the upper wiring extends, by the process of etching the upper portion of the lower wiring. The end of the lower wiring may have a dented shape. Accordingly, the via formed at the end of the lower wiring may not be connected to the lower wiring, and may not be connected to the lower wiring.

However, in the method of fabricating the semiconductor device according to embodiments, the upper surfaces of the lower wirings 110, 120 and 130 on which the upper via 210V is formed are not etched. That is, the upper surfaces of the lower wirings 110, 120 and 130, on which the upper via 210V is formed, do not have a recess formed by the etching process and are flat. Therefore, the upper via 201V may be in contact with the lower wirings 110, 120 and 130 and connected to the lower wirings 110, 120 and 130.

In the method of fabricating the semiconductor device according to embodiments, the upper via 210V may be aligned with the lower wirings 110, 120 and 130 in the first direction DR1 and the second direction DR2.

In FIG. 1, the description will be provided on the basis of the upper via 220V of the second upper wiring structure 220. The upper via 220V is aligned in the second direction DR2, a constant distance may be maintained between the upper via 220V and the first and third lower wirings 110 and 130, and a short circuit between the first via 220V and the first and third lower wirings 110 and 130 may be prevented.

Also, because the upper via 220V is aligned in the first direction DR1, a certain distance may be maintained between the upper via 220V and the first and third upper wiring structures 210 and 230, and a short circuit between the upper via 220V and the first and third upper wiring structures 210 and 230 may be prevented.

This makes it possible to suppress a time dependent dielectric breakdown (TDDB) and an electromigration, thereby improving and/or enhancing the reliability of semiconductor device.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor device comprising:
    a lower wiring comprising:
        a lower filling film, which extends in a first direction and comprises a first portion having a first width in the first direction and a second portion, having a second width smaller than the first width in the first direction, on the first portion; and
        a lower barrier film which is disposed on a side wall and a bottom surface of the first portion, and is not disposed on a side wall of the second portion in a cross-sectional view of the first direction; and
    an upper wiring structure comprising:
        an upper via connected to the lower wiring; and
        an upper wiring extending in a second direction intersecting the first direction on the upper via,
    wherein the upper via has a shorter width than the upper wiring in the second direction, and takes a form of protrusion from a bottom surface of the upper wiring facing the lower wiring in a third direction intersecting the first direction and the second direction,
    wherein the upper wiring structure further comprises an upper barrier film, and an upper filling film in a trench defined by the upper barrier film,
    wherein each of the upper via and the upper wiring comprises the upper barrier film and the upper filling film, and
    wherein the upper via is not separated from the upper wiring by the upper barrier film, and is separated from the second portion of the lower filling film by the upper barrier film.

2. The semiconductor device of claim 1, further comprising:
    a first interlayer insulating film which surrounds the first portion of the lower wiring, and is disposed on the side wall of the second portion of the lower filling film, in a cross-sectional view of the second direction; and
    a second interlayer insulating film which surrounds the upper wiring structure, and is disposed on the side wall of the second portion of the lower filling film, in the cross-sectional view of the first direction.

3. The semiconductor device of claim 2, wherein an upper surface of the second portion of the lower filling film is disposed on a same level as a top surface of the first interlayer insulating film.

4. The semiconductor device of claim 1, wherein the first width is a width of an upper surface of the first portion of the lower filling film, and
    wherein the second width is a width of a lower surface of the second portion of the lower filling film.

5. The semiconductor device of claim 1, wherein the first width decreases in a downward direction from the upper wiring structure, and
    wherein the second width increases in the downward direction from the upper wiring structure.

6. The semiconductor device of claim 1, wherein a width of the upper wiring structure in the first direction increases in an upward direction from the lower wiring.

7. The semiconductor device of claim 1, further comprising:
    an etching stop film disposed on an upper surface of the first portion of the lower filling film and the side wall of the second portion of the lower filling film, in the cross-sectional view of the first direction,
    wherein the upper via penetrates the etching stop film and is connected to the second portion.

8. The semiconductor device of claim 1, wherein the upper via is at least in a partial contact with an upper surface of the second portion of the lower filling film.

9. The semiconductor device of claim 1, wherein a width of a lower surface of the upper via is the same as a width of a top surface of the lower wiring, in the cross-sectional view of the second direction.

10. The semiconductor device of claim 1, wherein a width of a lower surface of the upper via is greater than a width of a top surface of the lower wiring, in the cross-sectional view of the second direction.

11. A semiconductor device comprising:
    a first lower wiring extending in a first direction;
    a second lower wiring extending in the first direction and spaced apart from the first lower wiring in a second direction intersecting the first direction; and
    an upper wiring structure comprising an upper via connected to the first lower wiring, and an upper wiring extending in the second direction on the upper via,
    wherein in a cross-sectional view of the second direction, an upper surface of the first lower wiring is disposed above a level of an upper surface of the second lower wiring,
    wherein the upper wiring structure comprises an upper barrier film, and an upper filling film which fills a trench defined by the upper barrier film,
    wherein each of the upper via and the upper wiring comprises the upper barrier film and the upper filling film, and
    wherein the upper via is not separated from the upper wiring by the upper barrier film, and is separated from the first lower wiring by the upper barrier film.

12. The semiconductor device of claim 11, wherein a side wall of the upper via does not comprise a step structure, and is in a straight line shape.

13. The semiconductor device of claim 11, wherein a width of the first lower wiring and a width of the second lower wiring in the second direction decrease in a downward direction from the upper wiring structure.

14. The semiconductor device of claim 11, wherein a width of the upper wiring structure in the second direction increases in an upward direction from the first and second lower wirings.

15. The semiconductor device of claim 11, further comprising a first interlayer insulating film, and a second interlayer insulating film on the first interlayer insulating film, wherein the first lower wiring and the second lower wiring are disposed inside the first interlayer insulating film, wherein the upper wiring structure is disposed inside the second interlayer insulating film, and wherein a top surface of the first interlayer insulating film is disposed above a level of the upper surface of the second lower wiring.

16. The semiconductor device of claim 15, wherein a part of the upper via is in contact with the first lower wiring, and a remaining part of the upper via is in contact with the first interlayer insulating film.

17. The semiconductor device of claim 15, further comprising an etching stop film between the first interlayer insulating film and the second interlayer insulating film, wherein the upper via penetrates the etching stop film and is connected to the first lower wiring.

18. The semiconductor device of claim 15, wherein the upper surface of the first lower wiring is disposed on a same level as the upper surface of the first interlayer insulating film.

19. A semiconductor device comprising:

a first interlayer insulating film;

a first lower wiring comprising:
  a lower filling film which extends in a first direction inside the first interlayer insulating film, and comprises a first portion having a first width in the first direction, and a second portion disposed on the first portion and having a second width smaller than the first width in the first direction; and
  a lower barrier film disposed between the first interlayer insulating film and the first portion of the lower filling film;

a second interlayer insulating film disposed on the first interlayer insulating film and the first lower wiring; and an upper wiring structure comprising an upper wiring extending in a second direction intersecting the first direction, and an upper via being in contact with the second portion of the lower filling film, inside the second interlayer insulating film, wherein each of the upper wiring and the upper via comprises an upper barrier film, and an upper filling film which fills a trench defined by the upper barrier film, wherein the upper via is not separated from the upper wiring by the upper barrier film, and is separated from the first lower wiring by the upper barrier film, wherein the first interlayer insulating film is disposed on both side walls of the second portion in a cross-sectional view of the second direction, wherein the second interlayer insulating film is disposed on both side walls of the second portion in a cross-sectional view of the first direction, and wherein the lower barrier film is disposed between the second portion of the lower filling film and the first interlayer insulating film, and is not disposed between the second portion of the lower filling film and the second interlayer insulating film.

20. The semiconductor device of claim 19, further comprising a second lower wiring extending in the first direction and spaced apart from the first lower wiring in the second direction, inside the first interlayer insulating film, wherein an upper surface of the second lower wiring is disposed below a level of the upper surface of the first lower wiring.

* * * * *